United States Patent [19]
Chen et al.

[11] Patent Number: 6,155,199
[45] Date of Patent: Dec. 5, 2000

[54] PARALLEL-ANTENNA TRANSFORMER-COUPLED PLASMA GENERATION SYSTEM

[75] Inventors: Jian J. Chen, Fremont, Calif.; Robert G. Veltrop, Boise, Id.; Thomas E. Wicker, Reno, Nev.

[73] Assignee: Lam Research Corporation, Fremont, Calif.

[21] Appl. No.: 09/052,144

[22] Filed: Mar. 31, 1998

[51] Int. Cl.$^7$ .................................................. C23C 16/00
[52] U.S. Cl. .................................. 118/723 I; 118/723 R; 118/723 IR
[58] Field of Search ........................... 118/723 R, 723 I, 118/723 IR

[56] References Cited

U.S. PATENT DOCUMENTS

| | | |
|---|---|---|
| 4,948,458 | 8/1990 | Ogle . |
| 5,231,334 | 7/1993 | Paranjpe . |
| 5,241,245 | 8/1993 | Barnes et al. . |
| 5,261,962 | 11/1993 | Hamamoto et al. . |
| 5,277,751 | 1/1994 | Ogle . |
| 5,280,154 | 1/1994 | Cuomo et al. . |
| 5,392,018 | 2/1995 | Collins et al. . |
| 5,401,350 | 3/1995 | Patrick et al. . |
| 5,464,476 | 11/1995 | Gibb et al. . |
| 5,522,934 | 6/1996 | Suzuki et al. . |
| 5,525,159 | 6/1996 | Hama et al. . |
| 5,529,657 | 6/1996 | Ishii . |
| 5,580,385 | 12/1996 | Paranjpe et al. . |
| 5,587,038 | 12/1996 | Cecchi et al. . |
| 5,900,699 | 5/1999 | Samukawa et al. ............ 118/723 I |
| 5,935,373 | 8/1999 | Koshimizu ..................... 118/723 I |
| 5,936,352 | 8/1999 | Samukawa et al. ............ 118/723 I |

FOREIGN PATENT DOCUMENTS

| | | |
|---|---|---|
| 0 517 042 | 12/1992 | European Pat. Off. . |
| 0 838 839 | 4/1998 | European Pat. Off. . |
| WO96/18208 | 6/1996 | WIPO . |
| WO97/21330 | 6/1997 | WIPO . |

OTHER PUBLICATIONS

Cristal, Edward G., "Coupled Circular Cylindrical Rods Between Parallel Ground Planes," IEEE Transactions on Microwave Theory and Techniques, vol. MTT–12, Jul., 1964, No. 4, pp. 428–439.

Chapman, Brian, "Glow Discharge Processes," John Wiley & Sons, New York, Dec., 1980, pp. 156–163.

Liberman, Michael A., Lichtenberg, Allan J., "Principles of Plasma Discharges and Materials Processing," John Wiley & Sons, Inc., New York, Dec., 1994, pp. 394–395.

Lamm, Albert J., "Observations of Standing Waves on an Inductive Plasma Coil Modeled as a Uniform Transmission Line," J. Vac. Sci. Technol. A. 15(5), Sep./Oct. 1997, pp. 2615–2622.

International Telephone and Telegraph Corp., "Reference Data for Radio Engineers,"0 $4^{th}$ ed. (Dec. 1957), pp. 588–599.

Patent Abstracts of Japan, vol. 095, No. 008, Sep. 29, 1995, JP 07 122397, May 12, 1995.

*Primary Examiner*—Scott Kastler
*Attorney, Agent, or Firm*—Burns, Doane, Swecker & Mathis, L.L.P.

[57] ABSTRACT

Radio frequency plasma coupling systems allow for controllable, uniform inductive coupling within a plasma reactor, as well as separately controllable, uniform capacitive coupling within the reactor. According to exemplary embodiments, a set of parallel coupling elements are positioned on a dielectric window of a plasma chamber, and the positioning of the elements and/or a set of phase shifters situated between the elements are used to force the radio frequency current flowing within the elements to be oriented in a common direction. Consequently, the inductively coupled fields generated by the elements are reinforcing, and induce a highly uniform plasma in the reactor. Further, the electrical characteristics of the elements are such that independently controllable and highly uniform capacitive coupling can be provided in order to prevent polymer buildup on components within the reactor.

34 Claims, 12 Drawing Sheets

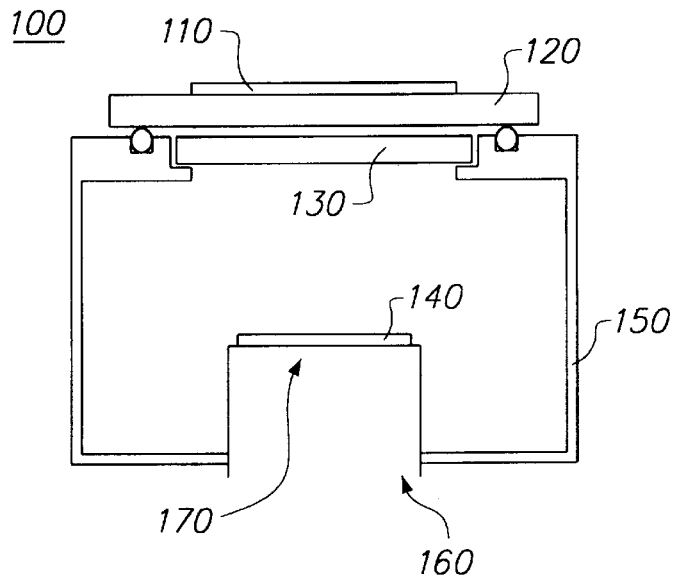
FIG. 1 PRIOR ART
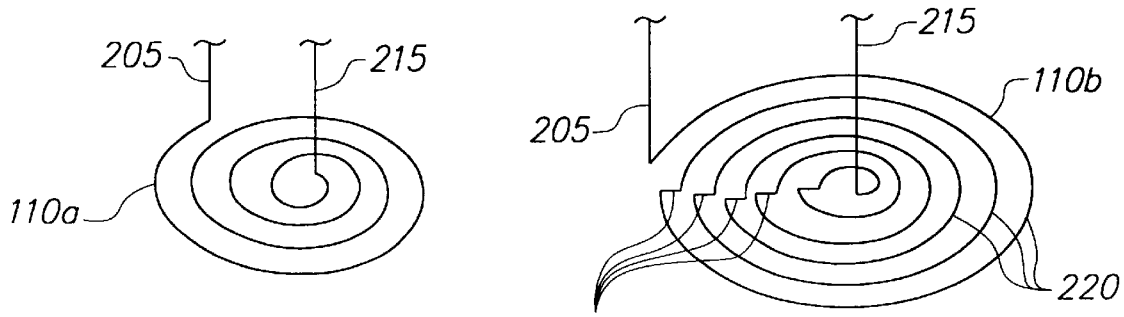
FIG. 2A PRIOR ART
FIG. 2B PRIOR ART
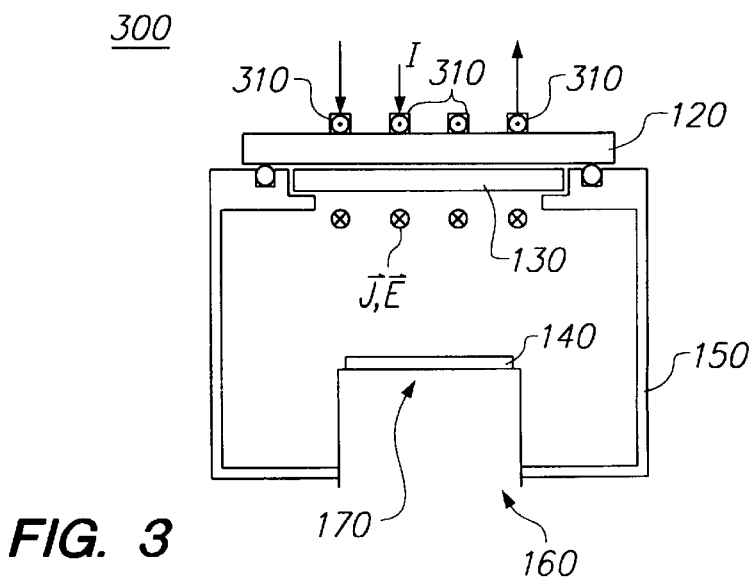
FIG. 3

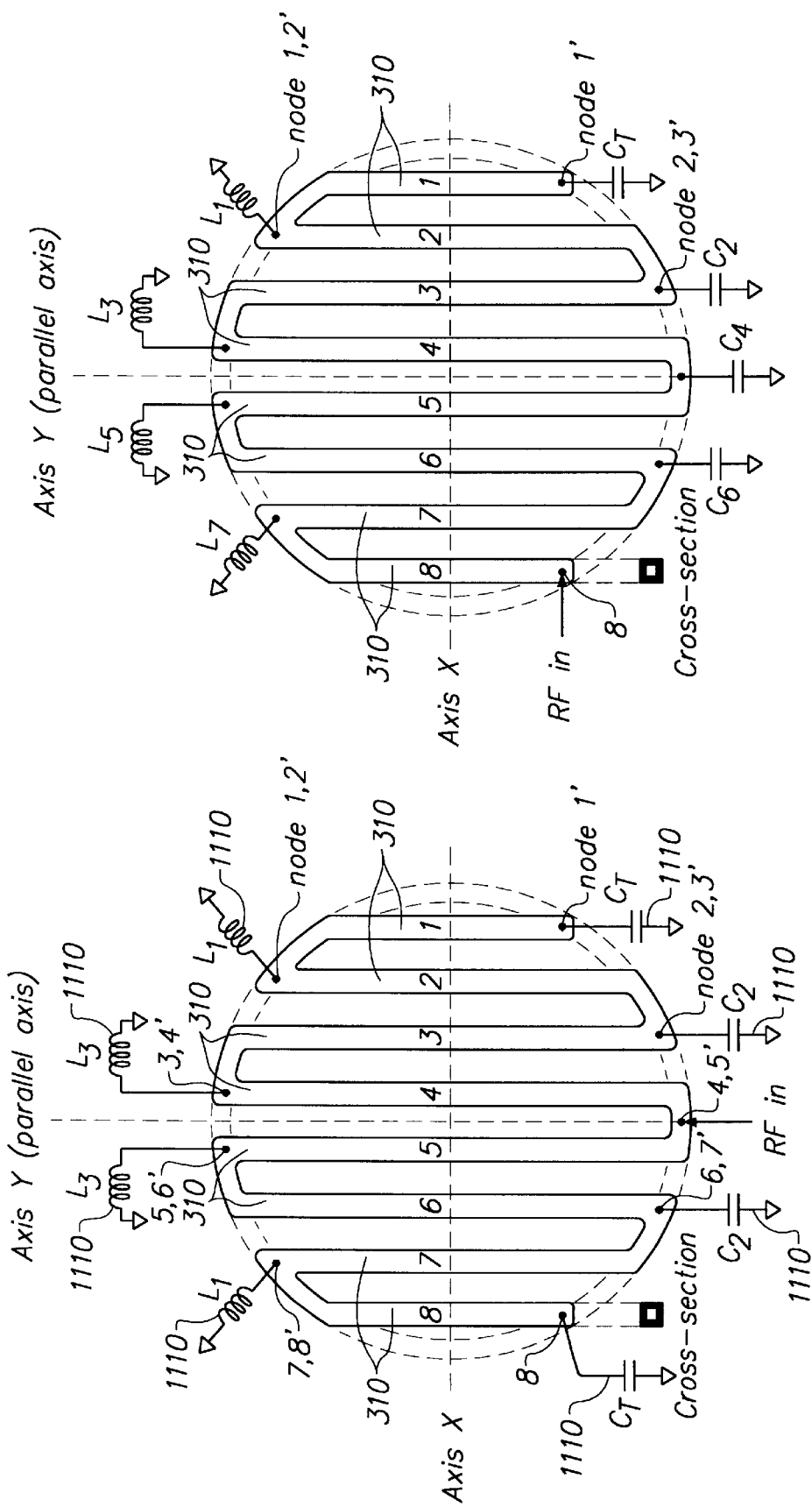

PARALLEL-ANTENNA TRANSFORMER-COUPLED PLASMA GENERATION SYSTEM

FIELD OF THE INVENTION

The present invention relates to plasma reactors for processing materials such as semiconductor substrates. More particularly, the present invention relates to methods and apparatus for inductively and capacitively coupling radio frequency energy into a reactor chamber for purposes of generating plasma within the chamber.

BACKGROUND OF THE INVENTION

Plasma generation is useful in a variety of semiconductor fabrication processes, for example plasma enhanced etching and deposition. Plasmas are generally produced from a low pressure gas by electric field ionization and generation of free electrons which ionize individual gas molecules through the transfer of kinetic energy via individual electron-gas molecule collisions. The electrons are commonly accelerated in an electric field, typically a radio frequency electric field.

Numerous techniques have been proposed to accelerate the electrons in an RF electric field. For example, U.S. Pat. No. 4,948,458 discloses a plasma generating device in which electrons are excited in a radio frequency field within a chamber using a planar antenna coil that is situated parallel to the plane of a semiconductor wafer to be processed. As shown in FIG. 1, such a plasma generating device 100 includes the planar antenna coil 110, a dielectric window 120, a gas distribution plate 130, the wafer to be processed 140, a vacuum chamber 150, an electrostatic chuck 160, and a lower electrode 170.

In operation, a radio frequency source (not shown) is used to provide a radio frequency current to the planar coil 110, typically via a radio frequency matching circuit (also not shown). The radio frequency current resonates through the planar coil 110, inducing a planar magnetic field within the vacuum chamber 150. At the same time, a process gas is introduced into the vacuum chamber 150 via the gas distribution plate 130, and the induced electric field ionizes the process gas to produce a plasma within the chamber 150. The plasma then impinges upon the wafer 140 (which is held in place by way of the electrostatic chuck 160) and processes (e.g., etches) the wafer 140 as desired. Another radio frequency, at a frequency which is different from that applied to the antenna coil, is typically applied to the lower electrode 170 to provide a negative DC bias voltage for ion bombardment.

FIGS. 2A and 2B depict two typical planar spiral coils 110a, 110b. As shown in FIG. 2A, a first planar coil 110a is constructed as a singular conductive element formed into a planar spiral and connected to radio frequency taps 205, 215 for connection to radio frequency circuitry. In FIG. 2B, an alternative planar coil 110b inter-connectors 225 and coupled at each end to radio frequency taps 205, 215.

As is well known in the art, the circular current pattern provided by such spiral coils creates toroidal-shaped plasmas which can in turn cause radial non-uniformity in etch rate at the wafer 140. In other words, the E-field inductively generated by the planar coil antenna 110 is generally azimuthal (having a radial component $E_r=0$ and an azimuthal component $E_\theta \approx 0$), but zero at the center ($E_r=0$ and $E_\theta=0$). Thus, the coil antenna 110 produces a toroidal plasma with lower density in the center, and must rely on plasma diffusion (i.e., electrons and ions diffuse into the center) to provide reasonable uniformity at the center of the toroid. In certain applications, however, the uniformity provided by plasma diffusion is insufficient.

Further, such spiral coil antennas tend to make the gas distribution plate 130 susceptible to build up of polymer (a by-product of the etch process). This results from the fact that the relatively long lengths of coupling lines used to construct the planar antenna coils have significant electrical length at the radio frequency at which they typically operate. As a result, a standing wave exists on the coil so that the voltage and current vary periodically along the length of the coil. If the coil is grounded at the terminal end, the current at the terminal end is at a maximum value, and the voltage at the terminal end is zero. Proceeding along the coil toward the input, the voltage increases and the current decreases until, at 90 degrees of electrical length, the voltage is at a maximum and the current is at a minimum. However, such a degree of variation would result in a highly non-uniform plasma. Consequently, the planar coil is typically terminated with a capacitance such that the current in the coil is similar at both ends of the coil and increases to a maximum near the middle of the coil. Doing so provides a reasonably uniform plasma density as described above.

However, at the point in the coil where the current is at its maximum, the voltage is at its minimum and the voltage rises to nominally equal values (of opposite polarity) at each end of the coil. As a result, the voltage at the minimum point is quite low, and since the adjacent turn on either side of the minimum are at opposite polarities, some fraction of the electric field is confined between the adjacent turn and only the differential portion of the field penetrates the plasma. Since a certain minimum level of voltage is required to prevent excessive polymer deposition in many applications, the above described planar coils may be unsuitable in certain instances. For example, in addition to affecting etch selectivity of oxide to photoresist at the wafer 140, polymer build up can also cause particle problems if polymer flakes fall onto the wafer during processing.

Note that, although the terminating capacitor value can be varied, doing so only changes the position of the voltage null along the coil. Further, although the coil can be terminated with an inductance in order to provide the same polarity voltage along the coil length, a current null will exist somewhere in the middle of the coil (with the current traveling in opposite directions on either side of the null), and the resulting plasma density can be unacceptably low and non-uniform. Thus, there is a need for improved methods and apparatus for generating plasma in a radio frequency plasma coupling system.

SUMMARY OF THE INVENTION

The present invention fulfills the above-described and other needs by providing radio frequency plasma coupling systems that allow for controllable, uniform inductive coupling within a plasma reactor, as well as separately controllable, uniform capacitive coupling within the reactor. According to the invention, a set of parallel coupling elements are positioned on a dielectric window of a plasma chamber, and the positioning of the elements and/or a set of phase shifters situated between the elements are used to force the radio frequency current flowing within the elements to be oriented in a common direction. Consequently, the electromagnetic fields inductively generated by the elements are reinforcing and uniform, and result in a highly uniform plasma as desired. Further, the electrical characteristics of the elements are such that independently controllable and highly uniform capacitive coupling can be provided in order to prevent polymer buildup as desired.

According to a first exemplary embodiment, an apparatus for generating a transformer coupled plasma includes a plasma reaction chamber having a window forming an electromagnetic field path into the chamber and a process gas supply configured to introduce process gas into the chamber. The exemplary apparatus also includes a radio frequency antenna comprising at least two antenna segments disposed proximate an exterior surface of the window of the chamber, and a radio frequency source coupled to the antenna and configured to resonate a radio frequency current in the antenna segments, wherein electromagnetic fields induced by the radio frequency current are effective to excite and ionize the process gas and to thereby generate a plasma within the chamber. The exemplary apparatus further includes a phase shifter interconnecting first and second of the antenna segments and configured to distribute radio frequency current flow in the antenna such that an instantaneous direction of radio frequency current in the first antenna segment is substantially the same as an instantaneous direction of radio frequency current in the second antenna segment.

An exemplary method for generating a transformer coupled plasma according to the invention includes the steps of introducing a process gas into a plasma reaction chamber, and applying a radio frequency current to an antenna comprising at least two antenna segments, a first and a second antenna segment being disposed proximate an exterior surface of a window of the chamber and interconnected via a phase shifter. According to the exemplary method, the phase shifter is effective to distribute radio frequency current flow in the antenna such that an instantaneous direction of radio frequency current in the first antenna segment is substantially the same as an instantaneous direction of radio frequency current in the second antenna segment, and the radio frequency current in the antenna is effective to excite and ionize the process gas and to thereby generate a plasma within the chamber.

The above-described and other features and advantages of the present invention are explained in detail hereinafter with reference to the illustrative examples shown in the accompanying drawings. Those skilled in the art will appreciate that the described embodiments are provided for purposes of illustration and understanding and that numerous equivalent embodiments are contemplated herein.

BRIEF DESCRIPTION OF THE DRAWINGS

FIG. 1 depicts a conventional plasma reactor, wherein a planar spiral coil antenna is used to couple radio frequency energy into a processing chamber;

FIGS. 2A and 2B depict two conventional planar spiral coil antennas;

FIG. 3 depicts an exemplary plasma reactor according to the invention, wherein multiple parallel antenna elements are used to couple radio frequency energy into a processing chamber;

FIG. 19 depicts an exemplary practical implementation of the planar, parallel-element antenna arrangement of FIG. 17;

FIG. 20 depicts an exemplary practical implementation of the planar, parallel-element antenna arrangement of FIG. 20.

DETAILED DESCRIPTION OF THE INVENTION

Figure 4:
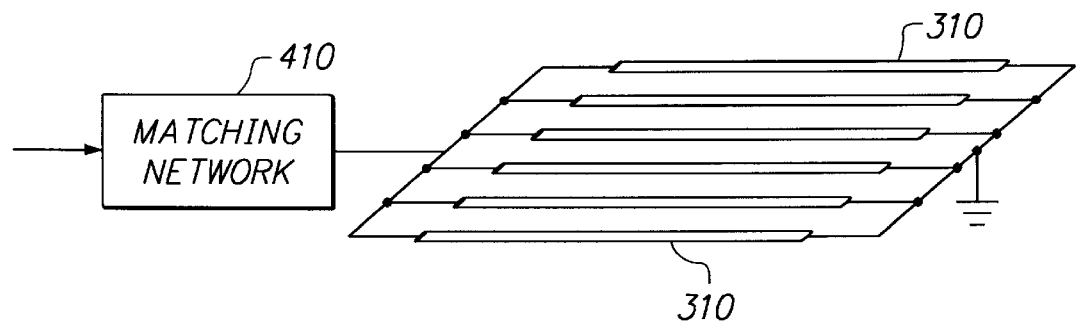
FIGS. 4, 5, 6 and 7 depict exemplary parallel-element antenna arrangements according to the invention, wherein current within each element flows essentially in a common direction to provide uniform inductive coupling of radio frequency energy to a processing chamber.

FIG. 3 depicts an exemplary plasma coupling system 300 according to the invention. As shown, in addition to the dielectric window 120, the gas distribution plate 130, the wafer 140, the vacuum chamber 150, the electrostatic chuck 160 and the lower electrode 170, the exemplary plasma coupling system 300 includes a set of parallel coupling elements 310. The parallel coupling elements 310 are arranged on the surface of the dielectric window 120 to provide a planar radio frequency coupling antenna. According to the invention, each element of the array is short, having less than 90 degrees of electrical length. Further, as is described in detail below, the magnitude of the current in each element 310 is made nominally the same value, and the current vector for each element 310 is made to be substantially in phase with the current vectors of each other element 310. Advantageously, since the net inductive coupling provided within the chamber 150 is proportional to the vector sum of the elemental currents, the coupling system 300 of the present invention generates a highly uniform plasma as compared to the conventional systems described above.

According to the invention, the parallel antenna elements 310 can be connected in several ways. For example, FIG. 4 shows an array of elements 310 fed in parallel from a matching network 410 and terminated with a short circuit or a prescribed reactance. Those skilled in the art will appreciate that a short circuit termination allows for high current at low voltage, while termination with a reactance reduces current but allows the voltage to increase.

With the elements 310 fed in parallel as shown in FIG. 4, the real component of the coupled plasma impedance is divided by the number of elements, resulting in a relatively low effective input resistance and a correspondingly higher Q. Therefore, it can be desirable to instead connect the elements 310 in series so that the real component of the plasma impedance coupled into each element 310 is also in series, resulting in a more reasonable effective input resistance value which can be more easily transformed to the generator impedance via the matching circuit 410.

Figure 5:
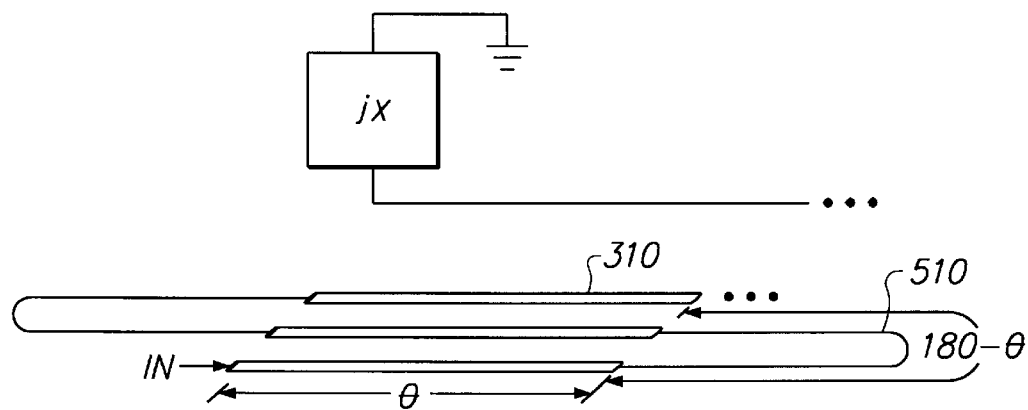

To achieve the above described benefits, however, the current in each element 310 is still made to be nominally in phase with the current in each of the other elements 310. Advantageously, the present invention provides a number of ways for doing so. For example, at higher radio frequencies, appropriate current phasing between elements 310 can be accomplished using interconnecting lengths of transmission line 510 as shown in FIG. 5. Taking the electrical length of one array element 310 to be 0 degrees, then an interconnecting cable 510 of (180−θ) degrees provides a current into the successive element that is out of phase with the first. However, since the successive element is connected in the opposite direction with respect to the previous element, the resulting currents are in the same direction and the inductive field is reinforced as desired.

Figure 6:
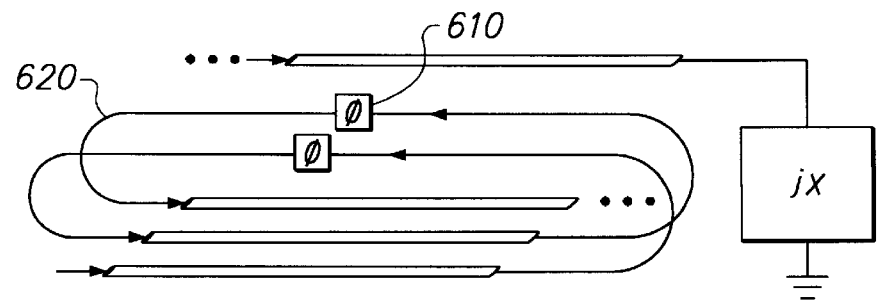
Figure 7:
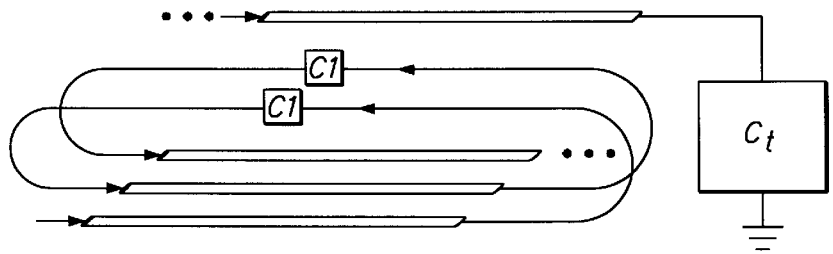

At lower radio frequencies, it can be more practical to loop the output of each array element 310 around to the input of a successive element, using a phase shifting network 610 to provide in-phase current into successive array elements 310, as shown in FIG. 6. For purposes of discussion, each phase shift network 610 can be reduced to a series capacitor without loss of generality. First consider a basic example where the effective characteristic impedance of the array elements 310 and the interconnecting loops 620 is $Z_0$, and the total electrical length of the loop, including the array elements, is theta θ. Such a configuration is shown in FIG. 7. The terminating capacitor $C_t$ for such a configuration is then:

$$C_t = \frac{1}{2*\pi*f*Z_0*\tan\left(\frac{\theta}{2}\right)}$$

and each internal capacitor $C_i$ is given by:

$$C_i = \frac{1}{2*\pi*f*Z_0*\tan\theta}$$

The current in each element of the array is then in phase with the current in each other element, thereby maximizing the inductive coupling to the plasma.

Figure 8A:
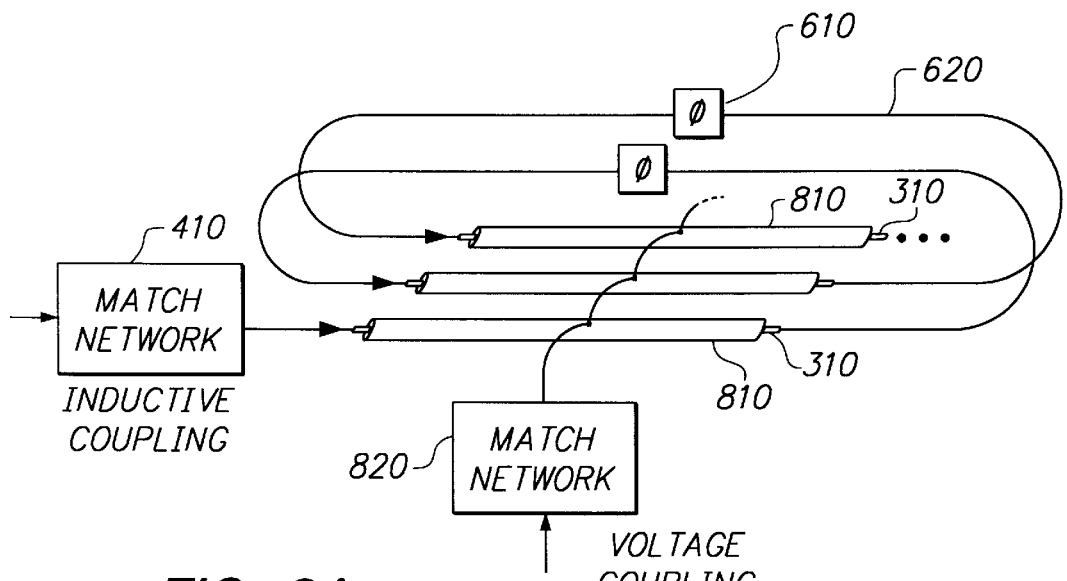
FIG. 8A depicts a parallel-element antenna arrangement according to the invention, wherein each element is enclosed within a conducting shield to provide for uniform capacitive coupling of radio frequency energy to a processing chamber.

Note that in the phase-corrected loop arrays of FIGS. 5 and 6, the voltage at each end of an array element is low and of opposite polarity, with a voltage minimum in the middle. Thus, in order to allow a radio frequency voltage to be applied to the array, each array element 310 can be enclosed with an unterminated shield 810 (similar to a coaxial transmission line) as shown in FIG. 8A. Advantageously, doing so does not disturb the uniform inductive coupling, since the same amount of radio frequency current is induced on the outside of each shield 810 as there is flowing on the corresponding inner conductor 310. Thus, a source of radio frequency voltage can then be applied to the center of the external shield 810 of each element 310 of the array. In other words, since each array element 310 has substantially the same voltage profile as adjacent elements, connecting the shields 810 together at the null points has minimal effect on the above described inductive coupling characteristic. The voltage coupling to the shield 810 provides bombarding potential for removal of polymer on the gas distribution plate 130.

As shown, an independent matching circuit 820 can be used to convert the effective plasma impedance due to voltage coupling to the generator impedance. The frequency of the generator used for voltage coupling can be at the same frequency as the generator used for inductive coupling since they are largely isolated due to circuit balance. Alternatively, the two generators can operate at different frequencies.

Figure 9:
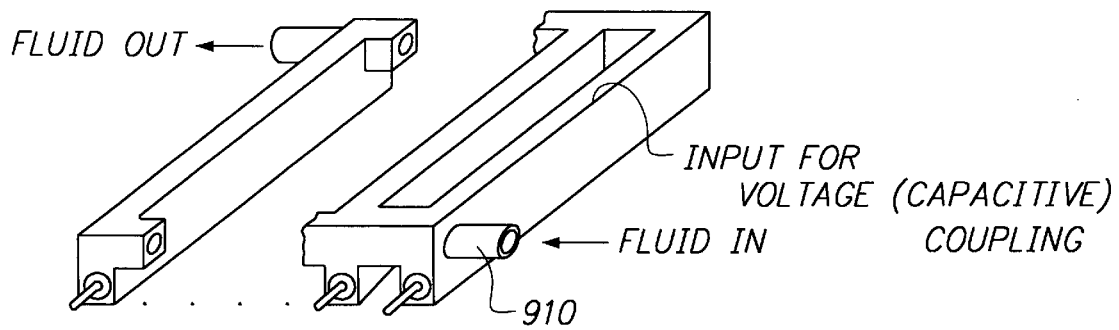
FIG. 9 depicts an exemplary antenna and cooling system according to the invention.

Also note that, since the potential of each shield 810 at the input side of the array is the same, the shields 810 can also be electrically connected together on the input side of the array without disturbing the circuit function. The same is true of the output side. Thus, to cool the array, and consequently the dielectric window 120, cooling fluid can be applied to one corner of the array, allowed to flow through tubular interconnections 910 (and in parallel through a passage in or surrounding each shield 810), and caused to exit at a diagonal corner of the array as shown in FIG. 9.

Figure 8B:
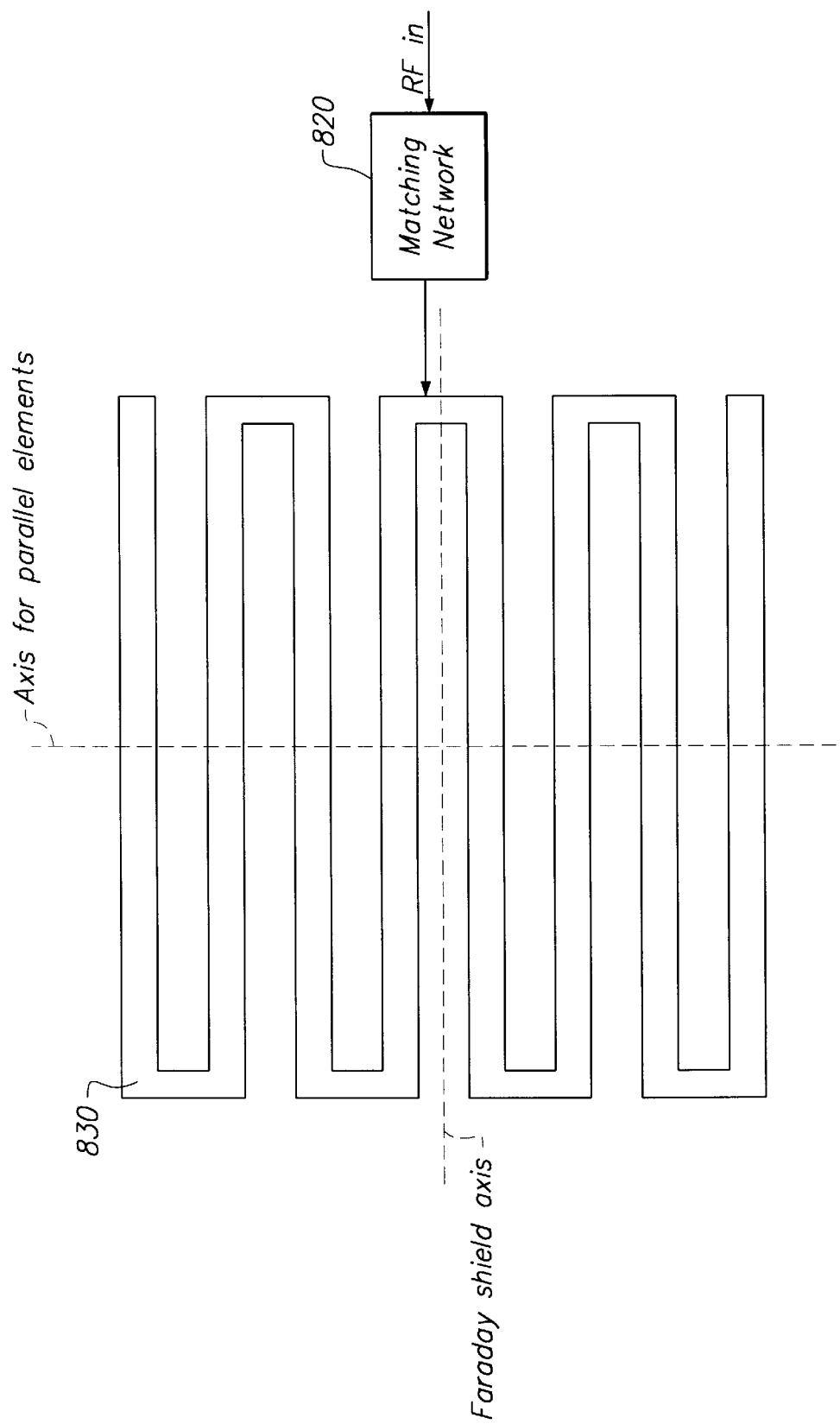
FIG. 8B depicts a Faraday shield according to the invention which can be used, as an alternative to the conducting shield arrangement of FIG. 8A, to provide uniform capacitive coupling of radio frequency energy to a processing chamber.

Note that if the coaxial-type antenna elements of FIG. 8A are replaced with single, solid conductors (i.e., if the dielectric insulation and the shield 810 of each coaxial element is removed), then maximum inductive coupling can be realized (since the radio frequency energy is no longer needed to couple first to the shield through a dielectric insulation). To compensate for the low voltage on the center of each antenna element in such case, a Faraday shield 830 according to the invention can be inserted between the dielectric window 120 and the gas distribution plate 130 as shown in FIG. 8B (where it is understood that a center axis of the Faraday shield 830 is oriented perpendicular to the parallel elements of FIG. 8A). Advantageously, separate radio frequency energy, either from a separate generator or from the same source used to drive the parallel-element antenna, can be used to power the Faraday shield 830 to provide the voltage coupling in a fashion similar to that described above with respect to FIG. 8A. The separate radio frequency can be either different from or the same as the frequency used to drive the parallel-element antenna. If a common radio frequency source is used, a high voltage point either in the matching network or in the antenna elements can be picked up to power the Faraday shield 830. Those skilled in the art will appreciate that the Faraday shield 830 can also be shaped to fit various reactor cross-sections (e.g., a circular outer perimeter, etc.).

Figure 10:
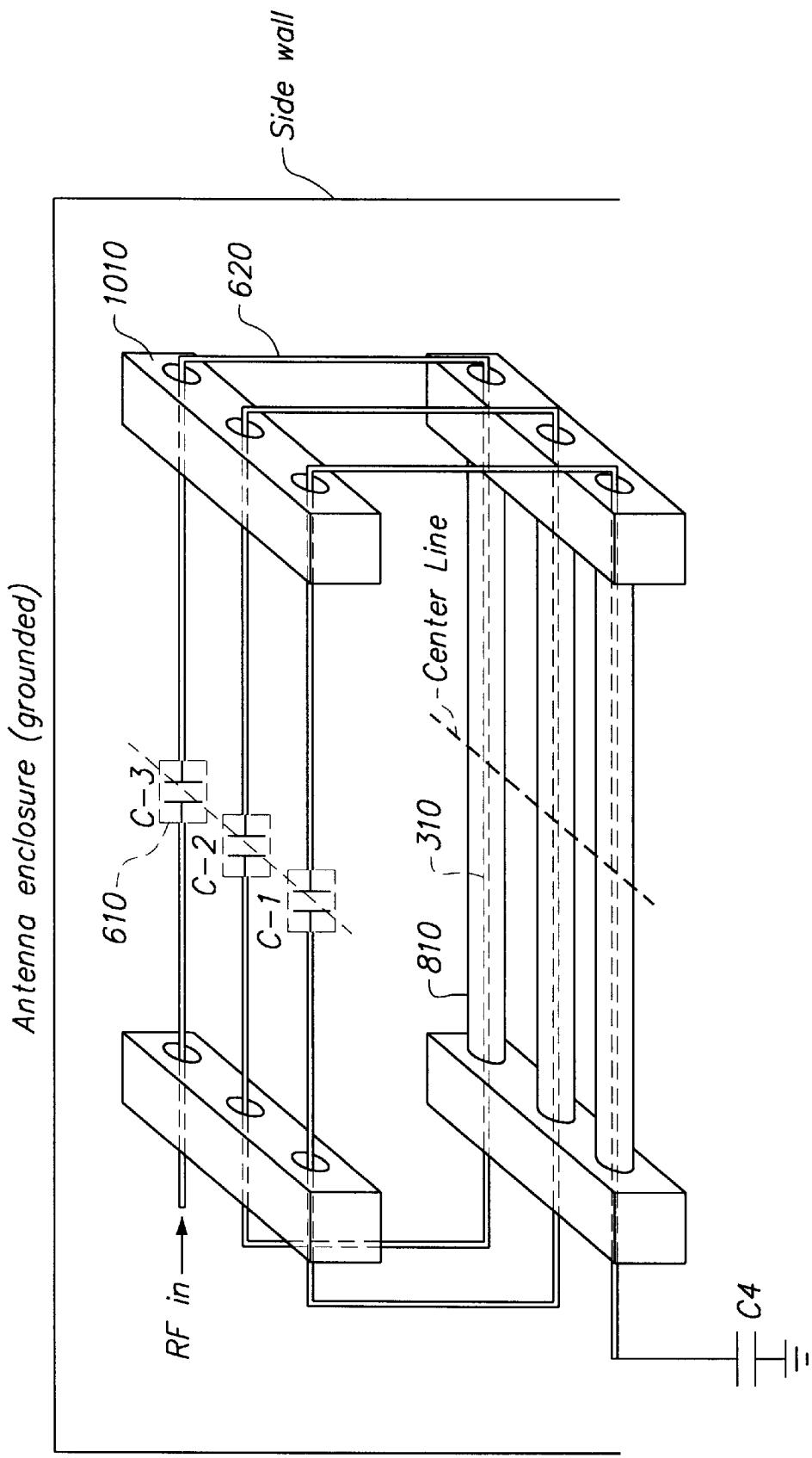
FIG. 10 depicts an exemplary practical implementation of a parallel-element antenna arrangement according to the invention.

A practical implementation of the above described, parallel-element plasma coupling system is depicted in FIG. 10. In the system of FIG. 10, the parallel antenna elements 310 are constructed from a set of 0.325-inch diameter, 10-inch long semi-rigid cables, in which the center conductor of each cable is directly connected to the radio frequency energy (to serve as an antenna element 310) while the outer conductor is floated (to serve as an element shield 810). As shown, the outer conductor directly contacts the dielectric window 120, and as described above, electromagnetic coupling from the center conductor induces an imaging current in the outer conductor which is inductively coupled to the plasma beneath the dielectric window. Each parallel element 310 is interconnected to the next element through a 3/16-inch outer-diameter copper tube 620, each tube being looped over 2.85 inches in height above the surface of the parallel elements 310. The entire structure is firmly supported by a frame 1010, which can be made, for example, of Ultem or Teflon-Glass G7 (G7 is perhaps a superior alternative in terms of preventing arcing through the dielectric).

As shown, tuning capacitors C4, C-1, C-2, C-3, . . . serve as the above described phase shifters 610 in the system of FIG. 10. According to the invention, the tuning capacitances C4, C-1, C-2, C-3, . . . are set such that the voltage minimum in each parallel antenna element is at its center, and such that the current is almost the same at both ends of each element (having a maximum near the center). Doing so provides a more uniform plasma as described above.

To compute the capacitances C4, C-1, C-2, C-3, . . . , the resulting plasma can be treated as a lossy, conductive medium, and the coupling between parallel antenna elements 310 and the plasma can be modeled as a lossy transmission line. See, for example, A. J. Lamm, "Observations of Standing Waves on an Inductive Plasma Coil Modeled as a Uniform Transmission Line", J. Vac. Sci. Technol. A 15(5), 2615, September/October 1997. In such a lossy line, the antenna element 310 provides one path for radio frequency energy, and the plasma provides another path. The voltage and current wave forms along a lossy transmission line are given by:

$$V(s) = V^+ e^{(\alpha+j\beta)s}(1 + \Gamma(s)) \quad (1)$$

$$I(s) = \frac{V^+ e^{(\alpha+j\beta)s}}{z_0}(1 - \Gamma(s))$$

where $V^+$ and $V^-$ are positive and negative traveling voltages, s is the distance from the load (i.e., from C4), $\alpha+j\beta$ is the complex propagation constant, $\Gamma(s)$ is the voltage reflection coefficient given by $$\Gamma(s) = \frac{V^-}{V^+} e^{-2\alpha s - j2\beta s} = \Gamma_0 e^{-2\alpha s - j2\beta s} \quad (2)$$

and $z_0$ is the characteristic impedance of the transmission line given by $$z_0 = \sqrt{\frac{R + j\omega L}{G + j\omega C}} \quad (3)$$

where R and L represent the series resistance and the inductance per unit length, G and C represent the shunt conductance and the shunt capacitance per unit length, and $\omega = 2\pi f$ (where f is the radio frequency).

The parameters of the lossy transmission line can then be derived from the amplitudes and phases of V and I at the input and output of a planar spiral coil as described in the above cited article by Lamm. In an exemplary etch process, the radio frequency power on a planar spiral coil is 1600 W at 13.56 MHz, and the bottom power is 750 W at 4 MHz. The pressure of $CHF_3$ is set at 4 mTorr, and the flow rate of $CHF_3$ is 100 sccm. The results for this process are:

$$\alpha = 0.018 \text{ m}^{-1} \quad (4)$$

$$\beta = 0.55 \text{ rad/m}$$

$$R = 0.15 \text{ }\Omega/\text{m}$$

$$L = 0.77 \text{ }\mu\text{H/m}$$

$$G = 0.30 \text{ }\mu\Omega^{-1}/\text{m}$$

$$C = 54 \text{ pF/m}$$

Then, using equations (3) and (4), the characteristic impedance of this lossy line is calculated as $$z_0 = 119.5 - j3.9 = 119.6 e^{-j1.87°} (\Omega) \quad (5)$$

Advantageously, the interconnection using the copper tubing between two parallel antenna elements can be treated as a lossless transmission line. The lossless transmission line can be easily deduced from a lossy transmission line by letting $$\alpha \to 0 \quad (6)$$

$$\beta \to k = \frac{2\pi}{\lambda} \text{ (}\lambda \text{ is the wavelength)}$$

The only parameter that must be known is the characteristic impedance $z_0$. Since each part of a copper wire can interact with the enclosure (i.e., ground wall) and other copper wires in the vicinity, it is difficult to obtain accurate characteristic impedances in practice. To obtain a good first-order approximation, however, only the coupling between two adjacent copper wires and the coupling between a wire and its nearby ground wall need be considered. This significantly simplifies the problem and allows one to estimate $z_0$ for various locations of copper wires.

For either vertical or horizontal wires, the interactions with the two sides of the enclosure walls are considered for the first or the last wire. For all other wires which are in the middle, the even-mode interaction between two adjacent wires and only the interaction with one side of the wall are considered. Therefore, the impedance of the first or the last wire should be different from those middle wires. The same treatment is used for left and right vertical wires.

In the exemplary embodiment of FIG. 10, the antenna enclosure is square, 15"×15"×5" (H), the copper wire spacing is 1 inch, the distance from the center of a vertical wire to the nearby side wall is 2 inches, and for the first or the last vertical wire, the distance from the center of the wire to the front or back wall is approximately 3 inches. Other dimensions are shown in FIG. 10. The results of estimation of characteristic impedance $z_0$ are listed below in Table I.

TABLE I

Characteristic impedance for different locations of copper wires

| Location of wire | Characteristic Impedance $z_0$ ($\Omega$) |
|---|---|
| first or last vertical wire | 228.2 |
| middle vertical wire | 298 |
| first or last top horizontal wire | 177 |
| middle top, horizontal wire | 154.4 |

At the interface between the lossy line and lossless line, one can have $$z(s) = \frac{V(s)}{I(s)} \quad (7)$$

$$\left(= z_{10} \frac{1 + \Gamma_1(s)}{1 - \Gamma_1(s)}\right)\Bigg|_{s-interface}$$

$$\left(= z_{20} \frac{1 + \Gamma_2(s)}{1 - \Gamma_2(s)}\right)\Bigg|_{s-interface}$$

where z(s) is the transmission line impedance at the interface, $z_{10}$ and $\Gamma_1$ denote respectively, characteristic impedance and reflection coefficient for transmission line type 1 at the interface, while $z_{20}$ and $\Gamma_2$ denote respectively, characteristic impedance and reflection coefficient for transmission line type 2 at the interface. To propagate from line 1 to line 2, one can use equation (7) to calculate $\Gamma_2$ at the interface for given $z_{10}$, $\Gamma_1$ and $z_{20}$.

At the tuning capacitor, one has $$z_{after} = z_{before} + \frac{1}{j\omega C} \quad (8)$$

which can be used to calculate $\Gamma$ after each capacitor. Advantageously, given equations (2) and (4)–(8) and Table I, one can propagate the wave to any location of the entire transmission line.

For example, starting the transmission line analysis from C4 (the load) towards the center of the first parallel antenna element, one can calculate the voltage reflection coefficient at the center of the first element ($\Gamma$ in equation (2)) as a function of C4. For a certain value of C4, one can find the phase angle of $\Gamma$ is 180°, i.e., $\Gamma=|\Gamma_0|e^{j180°}$. From equation (1), the voltage $V \sim (1-|\Gamma_0|)$, and V is a minimum. Once C4 is found which gives $\Gamma=|\Gamma_0|e^{j180°}$, the transmission line analysis can be continued from the center of this antenna element towards the center of the next nearby antenna element, through the interconnection copper wire and the tuning capacitor C-1. By changing the value of C-1, one can find the phase angle of $\Gamma$ is 180° at the center of the second element. The process is repeated for the rest of antenna elements, C-2, C-3, ..., and C-9 (assuming the total number of antenna elements is 10). The last capacitor C-10 is unnecessary because the loop is terminated to the radio frequency input. Advantageously, a C program has been written to perform the above transmission line analysis and to determine the capacitances C4, C-1, C-2 ..., and C-9 such that the phase angle of $\Gamma$ is 180° at the center of each antenna element. The results are listed below in Table II.

TABLE II

Capacitances C4, C-1, C-2 ..., and C-9, amplitude and phase angle of reflection coefficient $\Gamma$, and normalized impedance (to $z_0$ of the lossy transmission line) at the center of each antenna element.

| Capacitance (pF) | Reflection $\Gamma$ (amplitude) | Reflection $\Gamma$ (angle-degree) | Normalized Real | Imaginary |
|---|---|---|---|---|
| C4 = 1402 | 0.990913 | 179.999 | 0.00456421 | 5.93E-06 |
| C-1 = 300.8 | 0.972984 | 180.003 | 0.0136928 | -2.29E-05 |
| C-2 = 291.4 | 0.955388 | 179.994 | 0.228148 | 4.83E-05 |
| C-3 = 291.4 | 0.938108 | 179.996 | 0.0319343 | 3.09E-05 |
| C-4 = 291.5 | 0.921145 | 180 | 0.0410458 | 3.42E-06 |
| C-5 = 291.7 | 0.904499 | 179.995 | 0.0501451 | 4.41E-05 |
| C-6 = 291.8 | 0.888156 | 180 | 0.0592344 | 4.11E-06 |
| C-7 = 292 | 0.872119 | 180.004 | 0.0683079 | -3.80E-05 |
| C-8 = 292.3 | 0.856387 | 180 | 0.0773617 | -3.98E-06 |
| C-9 = 320.1 | 0.799074 | 179.997 | 0.111683 | 2.36E-05 |

In addition to the exemplary embodiments described above with respect to FIGS. 4–10, the present invention also provides several two-dimensional, parallel-element antenna configurations. The two-dimensional embodiments are relatively easy to construct and use minimum-length components for electric interconnection so as to be less lossy.

Figure 11:
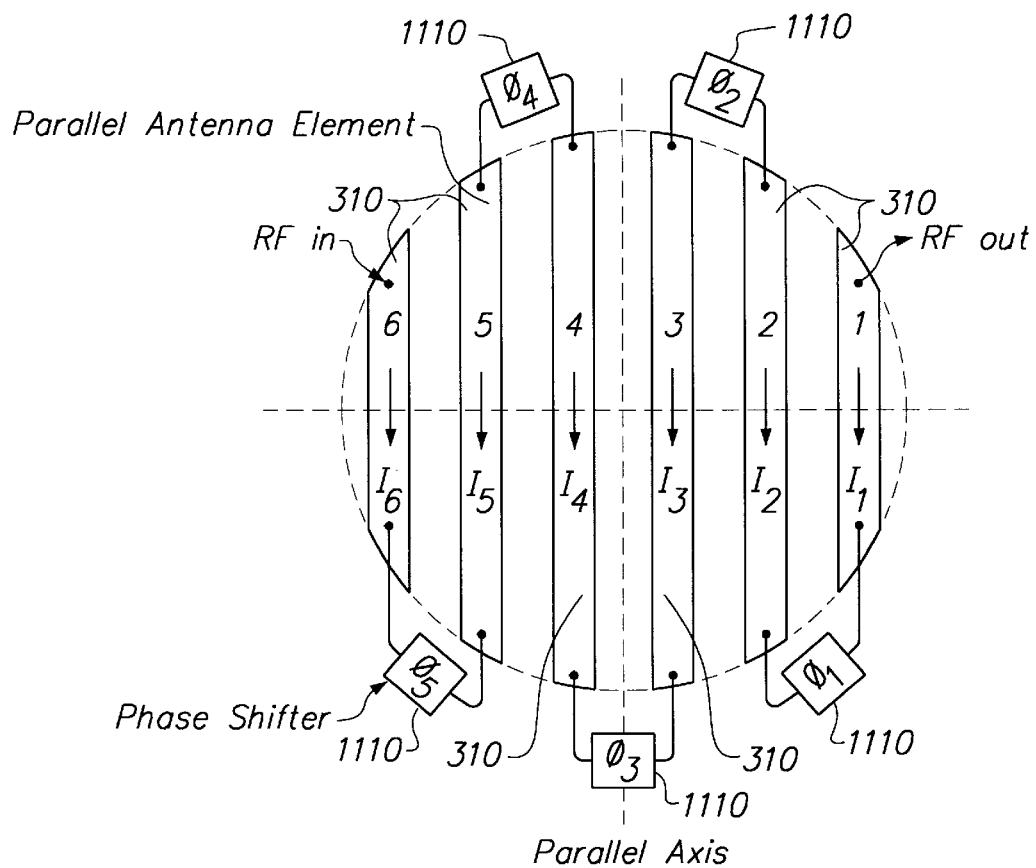
FIG. 11 depicts an exemplary planar, parallel-element antenna arrangement according to the invention.

FIG. 11 shows a first exemplary two-dimensional embodiment. As shown, the exemplary planar antenna includes six parallel antenna elements 310 (numbered 1–6) connected in series with a radio frequency input at one end of the sixth element and a radio frequency output at one end of the first element. The principle of operation is similar to that described above with respect to the three-dimensional embodiments of FIGS. 5–10. Specifically, the E-field induced by each element 310 is a closed loop having an axis perpendicular to the driving element. Near the dielectric window surface, the induced E-field is nearly parallel to its driving element, producing an image current (J=σE) under each element (see FIG. 3). Furthermore, each element is interconnected to the next element through a phase shifter ($\Phi_1$–$\Phi_5$) so that the current in one element is virtually in phase with the others. The magnetic field (B-field) produced by each in-phase current is thus mutually aiding within the plasma, resulting in a stronger B-field and consequently stronger induced E-field. As described above, this is an effective way of generating uniform, inductively coupled plasma. As a result, the antenna of FIG. 11 can produce a large radio frequency E-field that is uniform across the entire area of the antenna.

Note that the antenna configuration of FIG. 11 is applicable to plasma chambers of circular cross section and that the element lengths have end points which lie on a circle. This embodiment demonstrates that the antenna design of the present invention can accommodate various element lengths within a single array and still perform properly. Because of this, the overall antenna configuration can have a variety of two dimensional shapes, including square, rectangular, and circular shapes. In addition, since longer element lengths can be readily used, the parallel-element antennas of the present invention are ideally suited to large area plasma processing such as flat panel displays and larger size circular reactors such as those intended for wafers 300 mm and larger.

Also note that, although the parallel antenna elements 3 10 in the embodiment of FIG. 11 are straight and lie in a two-dimensional plane, the present invention is not restricted to planar geometry. For example, each element can be bent or otherwise formed into other shapes (e.g., curved elements rather than straight elements), and the entire antenna configuration can be non-planar (e.g. forming a dome over the plane of the dielectric window 120). Advantageously, the principles described above are readily applicable to such alternatively shaped systems, and such systems can thus be used to obtain results similar to those provided by the purely two-dimensional configurations.

Figure 12:
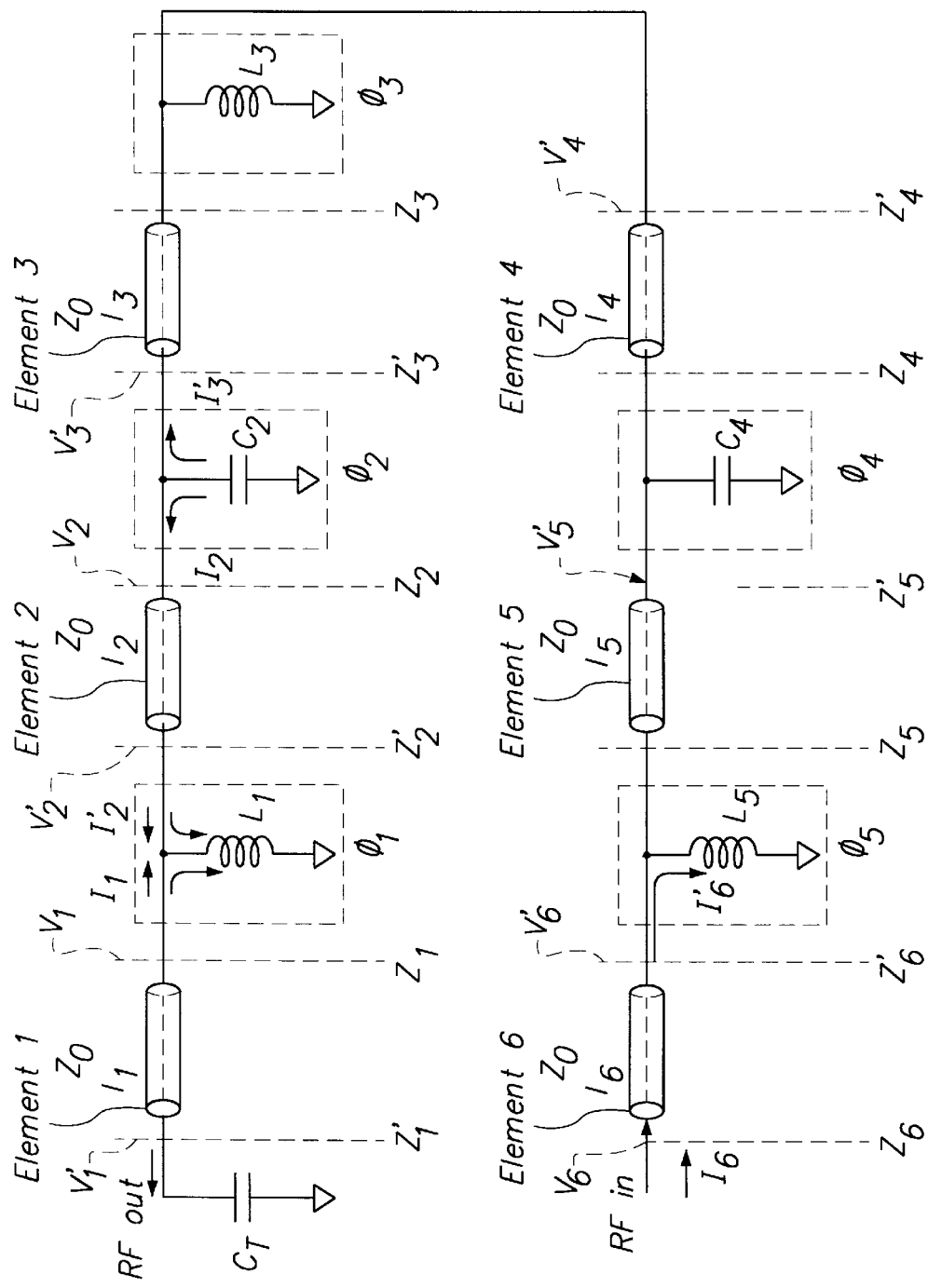
FIGS. 12, 13A and 14A are circuit diagrams depicting operation of the planar, parallel-element antenna arrangement of FIG. 11.
Figure 13A:
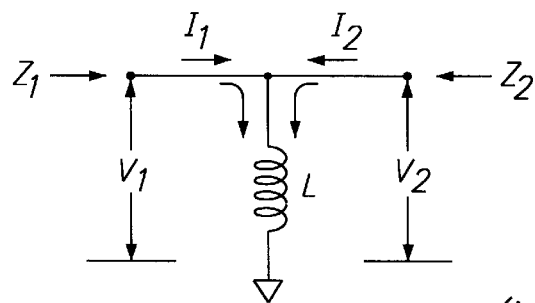
Figure 13B:
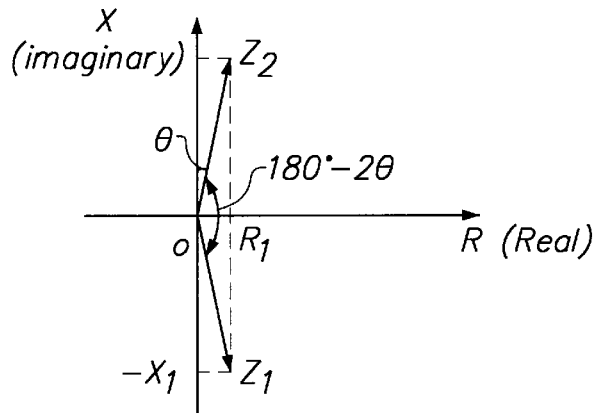
FIGS. 13B and 14B depict complex impedances within the circuit diagrams of FIGS. 13A and 14A, respectively.

To provide in-phase currents in the elements 310 of the configuration of FIG. 11, a shunt-type phase shifter 1110 is positioned between each pair of adjacent elements 310 as shown. To analyze the antenna configuration of FIG. 11, the antenna can be conceptually unfolded and approximated as a one-dimensional lossy transmission line as shown in FIG. 12. In FIG. 12, the radio frequency output (RF out) from the antenna is terminated by a capacitor $C_T$. At each junction between two adjacent elements (i.e., at each node), a phase shifter 1110 shifts the phase of the current by approximately 180° so that the currents of two adjacent antenna elements 310 flow in opposite directions toward the junction. Therefore, when the antenna is configured as in FIG. 11, the currents of the adjacent antenna elements 310 flow in the same direction.

Where the reactive component of the input impedance is capacitive, a shunt inductor (L) can be used as the phase shifter 1110 for the current. FIGS. 13A and 13B show a shunt L phase shifter with input voltage $V_1$, current $I_1$, and impedance $z_1$ and output voltage $V_2$, current $I_2$, and impedance $z_2$. Letting $R_1$ and $-X_1$ ($X_1>0$) denote the resistance and capacitive reactance of $z_1$, then $z_1=R_1-jX_1$. As shown in FIG. 13B, $z_1$ can be represented as a vector in a complex R-X plane with an angle of $\theta=\tan^{-1}(R_1/X_1)$ to the X-axis.

For the case $R_1 \ll X_1$, $\theta$ is small, and one can choose the inductance L such that $z_2$ is the complex conjugate of $z_1$, i.e., $z_2=z_1^*$. For this condition, the phase angle between $z_2$ and $z_1$ is $180°-2\theta \approx 180°$ (see FIG. 13B). Since $I_1=V_1/z_1$ and $V_1=V_2$, it then follows that $$I_2 = \frac{V_2}{z_2} = \frac{V_1}{z_1 e^{j(180-2\theta)}} = I_1 e^{-j(180-2\theta)} \approx I_1 \text{ (as } \theta \to 0)$$

The phase of $I_2$ is thus shifted 180° from $I_1$ i.e., the current reverses its direction after the phase shifter. The current flowing through the inductor is the sum of the magnitudes of $I_1$ and $I_2$, and the shunt inductance L can be calculated from $$\frac{1}{z_2} = \frac{1}{z_1} + \frac{1}{j\omega L}$$

For these conditions $R_1 \ll X_1$ and $z_2 = z_1{}^*$, resulting in $$\omega L \approx \frac{X_1}{2}$$

Figure 14A:
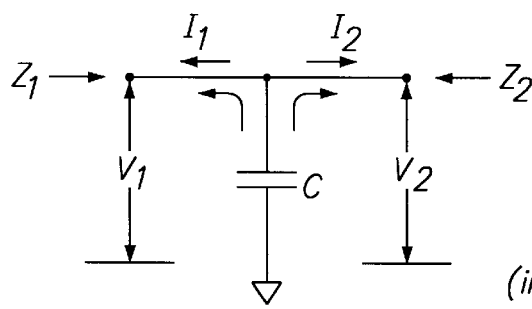
Figure 14B:
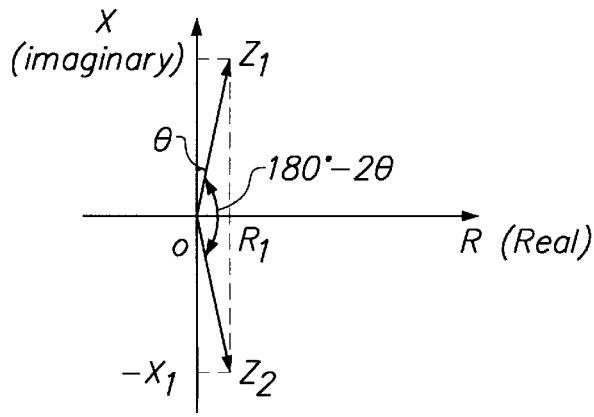

Alternatively, if the reactive component of the input impedance is inductive, a shunt C can be used as the phase shifter 1110 for the current. FIG. 14A shows a shunt C phase shifter. The analysis is similar to the above shunt L phase shifter. For example, letting $R_1$ and $X_1$ ($X_1 > 0$) denote the resistance and inductive reactance of $z_1$, then $z_1 = R_1 + jX_1$.

For the case $R_1 \ll X_1$, $\theta$ is small, and one can choose the capacitance $$\frac{1}{\omega C} \approx \frac{X_1}{2}$$

such that $z_2$ is the complex conjugate of $z_1$, i.e., $z_2 = z_1{}^*$. For these conditions, the phase of $I_2$ is shifted ~180° from $I_1$, i.e., the current approximately reverses its direction.

In an exemplary implementation, six parallel elements 310 separated by 2 inches are laid in a circle of 11-inch diameter. As described above, the complex propagation constant ($k = \alpha + j\Theta$) for a planar coil antenna can be deduced from the voltage and the current waveform measurements at the input and the output of the coil antenna. For purposes of discussion, $\alpha$, $\beta$ and the effective characteristic impedance $z_0$ are assumed to be the same. Table III then lists $\alpha$, $\beta$ and $z_0$ for $C_T$=60 pF, the actual lengths of elements 1–6 and the corresponding electrical lengths $l_1$–$l_6$.

TABLE III

| $\alpha = -6.89 \times 10^{-4}/°$ | | $\beta = 1.145°/\text{in}$ | | $C_T = 60$ pF | | $Z_0 = 110 \, \Omega$ |
|---|---|---|---|---|---|---|
| Element | #1 | #2 | #3 | #4 | #5 | #6 |
| Actual Length (in) | 3.58 | 8.77 | 10.4 | 10.4 | 8.77 | 3.58 |
| Electrical length $l_i$ (°) | 4.1 | 10.0 | 11.9 | 11.9 | 10.0 | 4.1 |

Figure 15:
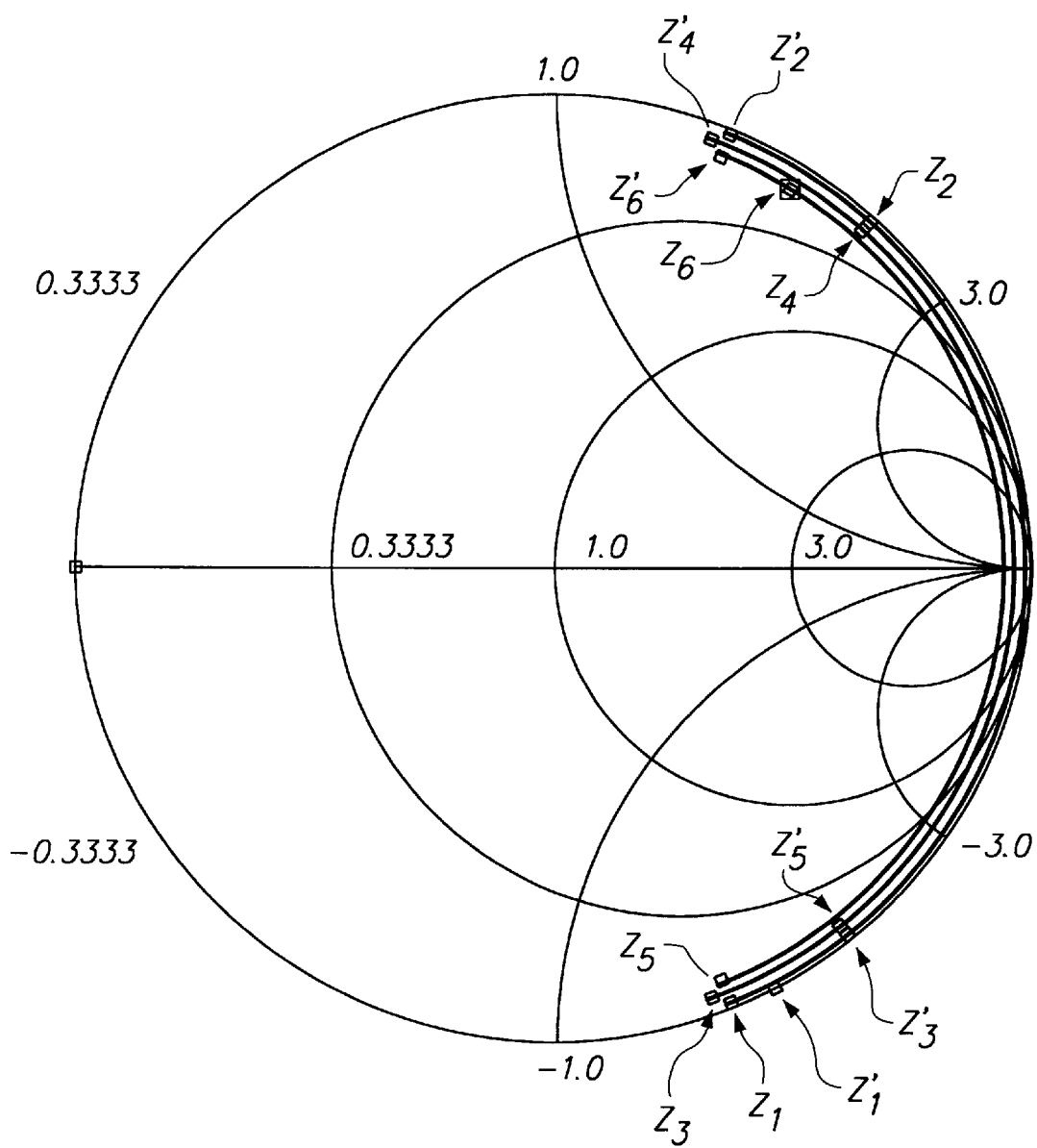
FIG. 15 depicts complex impedances within the circuit diagram of FIG. 12 in a Smith Chart.

Referring to FIG. 12, one can use a Smith Chart to analyze the unfolded lossy transmission line starting from the termination capacitor $C_T$. For simplicity, all the impedances are normalized to $z_0$ in the discussion that follows unless otherwise specified. Let $z_1$–$z_6$ denote the input impedance of elements 1–6 looking from the radio frequency input to the termination capacitor $C_T$, and let $z_1'$–$z_6'$ represent the output impedance of elements 1–6 looking from the radio frequency input to the termination capacitor $C_T$. Then, at 13.56 MHz, the impedance after $C_T$ is $z_1' = -j\,1.78$. Further, after the first segment of transmission line of electrical length $l_1 = 4.1°$, if it were lossless, the reflection coefficient would be $\Gamma_1 = 1.0 @ -66.9°$. Taking the loss into account, $\Gamma_1 \to \Gamma_1 \exp(-2\alpha l_1) = 0.994 @ -66.9°$ with corresponding $z_1 = 0.01 - j\,1.51$. Choosing the shunt $L_1 = 976$ nH, such that $z_{2'=z1}{}^* = 0.01 + j1.51$. The same procedure is repeated for the rest of the transmission lines and phase shifters. The resulting impedances $z_1'$, $z_1$–$z_6'$, $z_6$ are indicated in the Smith Chart of FIG. 15. Table IV lists the values of the normalized impedance $z_1'$, $z_1$–$z_6'$, $z_6$, the reflection coefficients $\Gamma_1'$, $\Gamma_1$–$\Gamma_6'$, $\Gamma_6$, and the phase shifters for $C_T = 60$ pF.

TABLE IV

| Element i | 1 | 2 | 3 | 4 | 5 | 6 |
|---|---|---|---|---|---|---|
| Output $\Gamma_i'$ | 1 @ -58.7° | 0.99 @ 67° | 0.98 @ -47° | 0.96 @ 70.6° | 0.95 @ -46.8° | 0.94 @ 66.8° |
| Input $\Gamma_i$ | 0.994 @ -66.9° | 0.98 @ 47° | 0.964 @ -70.8° | 0.948 @ 46.8° | 0.935 @ -66.8° | 0.93@ 58.6° |
| Output $z_i'$ | 0 - j 1.78 | 0.01 + j.151 | 0.06 - j 2.3 | 0.05 + j 1.41 | 0.17 - j 2.3 | 0.11 + j 1.51 |
| Input $z_i$ | 0.01 - j 1.51 | 0.06 + j 2.3 | 0.03 - j 1.41 | 0.17 + j 2.3 | 0.11 - j 1.51 | 0.15 + j 1.77 |
| Shunt L (nH) or C (pF) | $L_1 = 976$ | $C_2 = 92.8$ | $L_3 = 910$ | $C_4 = 92.3$ | $L_5 = 981$ | |

As mentioned above, one advantage of the two-dimensional configuration of FIG. 11 is its scalability to large area plasma processing such as 300 mm wafer processing and flat panel display applications. As seen in Table IV, the phase shifters 1110 change alternately between shunt L and shunt C. As a result, the impedance change due to the electrical length of each antenna element 310 tends to be corrected by the phase shifter 1110 that follows. Therefore, the overall impedance of this antenna arrangement changes slightly as the number of antenna elements 310 increases or as the length of each element 310 changes.

Advantageously, the exemplary embodiment of FIG. 11 can be modified or optimized to obtain certain desired magnitude and phase of the current and the voltage in the elements 310 of the array. The objectives here are not only to achieve near 180° out-of-phase current between two adjacent elements but also to maintain uniformly high current and voltage magnitudes across the array. The in-phase current with uniformly high magnitude across the array can generate effective inductively coupled plasma. Ideally the voltage magnitude should be maintained at a high enough level for removing polymer on the gas distribution plate 130. It is possible to have relatively large magnitudes of current and voltage at the same time for given total radio frequency input power, since the power is also determined by the relative phase difference ($\phi$) between the current V and voltage I. The power is given by $P=V_{rms}I_{rms}\cos\phi$ where $V_{rms}$ and $I_{rms}$ are rms voltage and current, respectively. By maintaining $\phi$ close to 90°, both $V_{rms}$ and $I_{rms}$ can be large.

In practice, a magnitude of reactance can be chosen as a pivot point for the array impedance to oscillate about, and values of shunt reactance can be selected such that this is the magnitude of the circuit impedance at the center of each successive array element. Given, for example, $z_0=110\,\Omega$, the normalized reactance is chosen to be −1 at the center of the first element, +1 at the center of the second element, and continues to repeat throughout the array. Note that this is the same as saying that the impedance shall be constant and conjugate in alternate elements along the centerline of the antenna array.

Figure 16:
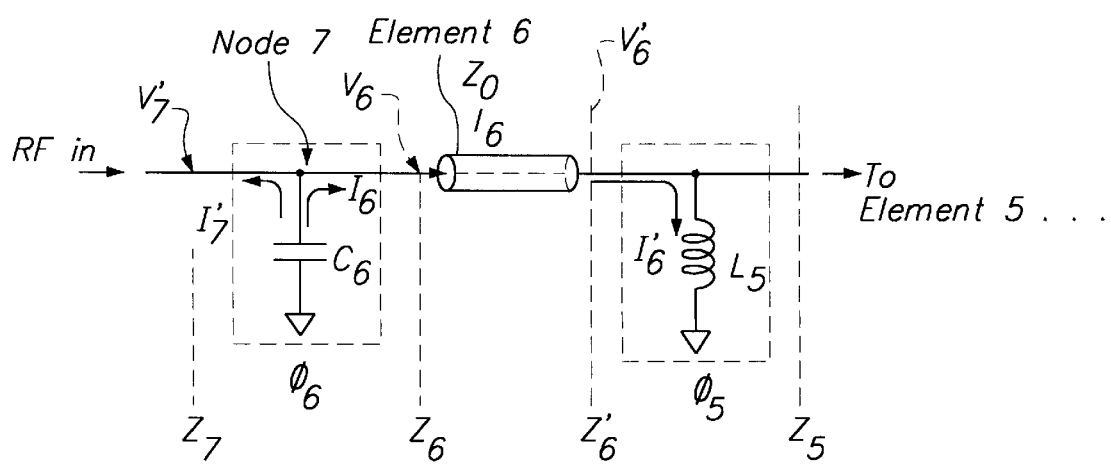
FIG. 16 is a circuit diagram depicting operation of a variation of the planar, parallel-element antenna arrangement of FIG. 11.

According to an exemplary embodiment, an antenna at 13.56 MHz is designed so that the impedance at the center of each element=R±j110 $\Omega$ (where R is the resistance). In addition to the phase shifters $\Phi_1$–$\Phi_5$ of FIG. 12, a phase shifter $\Phi_6$ (a shunt capacitor $C_6$) is inserted at the node of the radio frequency input and element 6 as shown in FIG. 16. Therefore, radio frequency from the matching network is delivered to the input node 7 of $\Phi_6$, everything else is similar to what is shown in FIG. 12, and the last element in the array is element 1 which is terminated by $C_T$. Note that when the element lengths are symmetrical about the center of the array, then the shunt elements are also symmetrical when designed in this fashion. Here $\alpha$, $\beta$ and the effective characteristic impedance $z_0$ are taken to be the same as in Table IV. The values of $z_1'$, $z_1$–$z_6'$, $z_6$ and $z_7$, which are normalized to $z_0=110\,\Omega$, and the phase shifters $\Phi_1$–$\Phi_6$ for given $C_T=99.3$ pF are listed in Table V.

The consistency of the magnitude and phase of the current in the various elements is a function of the line lengths and Q of the circuit. The absolute phase of the currents in the table above alternates approximately between +90° and −90° before and after each node (i.e., after each junction of two neighbor elements). For example, at node 1 of the phase shifter $\Phi_1$ (see FIG. 12), the input current is $I_2'$ with a phase angle of −93.3°, while the output current $I_1$ is phase shifted to +86.1°. The phase variations are within +2.6° and −6° from ±90°. The phase difference of the currents between two adjacent elements is 175.82° on average with standard deviation 2.6°. Therefore, the magnetic fields generated by these in-phase currents are almost perfectly in phase with uncertainty less than 1% due to the current phase error.

Another advantage of this embodiment is that the voltage across the array is maintained to be uniformly high, and varies from 1106 V (rms) to 1363 v (rms) with variation 23%. The high radio frequency voltage is used to remove polymer on the gas distribution plate 130. Since a shunt element is used at each node, one has $V_i=V_{i+1}'$.

The voltage will vary almost linearly along each element. For example, for element 3, the voltages at its two ends are $V_3'=1363$ V (rms) and $V_3=V_4'=1106$ V (rms), respectively. The voltage at the center of element 3 is ~1235 V (rms). As seen in the above table, the phase difference ($\phi$) between $I_1$ (or $I_i'$) and $V_i'$ is close to either +90° or −90°, so it is possible to have relatively large $V_{rms}$ and $I_{rms}$ at the same time. Note that $C_6$ is used to increase the voltage at the input end of element 6, otherwise $V_6$ would be significantly lower.

The impedance along an element is reduced moving toward the generator away from a shunt capacitor. As the impedance is reduced, the current increases and the voltage decreases. For example, along element 3, $|z_3'|>|z_3|$ (Table V),

TABLE V

| element i | 1 | 2 | 3 | 4 | 5 | 6 | node 7 |
|---|---|---|---|---|---|---|---|
| Input $z_i$ | 0.0053 − j 0.931 | 0.0228 + j 1.192 | 0.0296 − j 0.811 | 0.066 + j 1.235 | 0.0545 − j 0.834 | 0.0841 + j 1.071 | 13.696 − j 0.455 |
| Output $z_i'$ | 0 − j 1.075 | 0.0043 + j 0.840 | 0.0243 − j 1.233 | 0.0298 + j 0.813 | 0.0608 − j 1.185 | 0.0677 + j 0.929 | |
| L (nH) or C (pF) | $L_1=570$ | $C_2=176$ | $L_3=525$ | $C_4=176$ | $L_5=570$ | $C_6=99.3$ | |

Letting $I_1$ denote the current at the input end (closer to the radio frequency input) of element i (i=1, 2 . . . 6) and node 7, letting $I_1'$ represent the current at the output end (closer to $C_T$) of element i, and letting $V_i'$ represent the voltage at the output end (closer to $C_T$) of element i (i=1, 2 . . . 6) and node 7, the voltage at the input end $V_i=V_{i+1}'$, then Table VI lists the magnitudes and phase angles of $I_i$, $I_i'$, and $V_i'$ for element i (i=1, 2 . . . 6) and node 7 for conditions described in Table V, and for input power 1000 Watts.

TABLE VI

| element i | $(I_i)_{rms}$(A) | Angle $(I_i)$ | $(I_i')_{rms}$(A) | Angle $(I_i')$ | $(V_i')_{r,s}$(V) | Angle $(V_i')$ |
|---|---|---|---|---|---|---|
| node 7 | 0.81 | +0.0° | 0.81 | −0.0° | 1228 | −1.9° |
| 6 | 10.40 | −87.4° | 11.16 | −87.9° | 1143 | −2.0° |
| 5 | 12.43 | +84.2° | 10.44 | +84.0° | 1362 | −3.0° |
| 4 | 10.02 | −90.0° | 12.35 | −91.0° | 1106 | −3.1° |
| 3 | 12.39 | +84.8° | 10.05 | +85.0° | 1363 | −3.9° |
| 2 | 10.39 | −92.8° | 12.38 | −93.3° | 1143 | −3.6° |
| 1 | 11.16 | +86.1° | 10.39 | +86.2° | 1228 | −3.8° |

$(I_3')_{rms}<(I_3)_{rms}$, and $(V_3')_{rms}>(V_3)_{rms}=(V_4')_{rms}$ (Table VI). Conversely, the impedance along the next element is increased moving toward the generator away from a shunt inductor, the current decreases and the voltage increases, i.e., along element 4, $|z_4'|<|z_4|$, $(I_4')_{rms}>(I_4)_{rms}$, and $(V_4')_{rms}<(V_4)_{rms}=(V_5')_{rms}$. Since the array is folded, all of the shunt capacitors are on one side of the array and all of the shunt inductors are on the opposite side. Consequently, there is a consistent taper in the magnitude of the current across the array. Therefore the inductive coupling to plasma is slightly tapered down from the inductor end to capacitor end.

For this example, the current and therefore the magnetic field is 20–25 % stronger on the inductor side of the array than it is on the capacitor side. The radio frequency voltage is the opposite, being 20–25% higher on the capacitor side of the array than it is on the inductor side. Higher voltage results in higher capacitive coupling to the plasma. This is normal behavior for standing waves on transmission lines. However, there are various ways to compensate for this. The size of the elements and hence the characteristic impedance can be tapered such that the elements have a lower impedance at the capacitor side of the array. Alternatively, the ground plane above the array can be sloped to be closer to the array at the capacitor side. Either of these approaches, or a combination of both, tends to equalize the radio frequency voltage as well as the current. The spacing in the array can be increased at the inductor side such that the array is somewhat trapezoidal. This tends to equalize the magnetic field but not the electric field.

Figure 18:
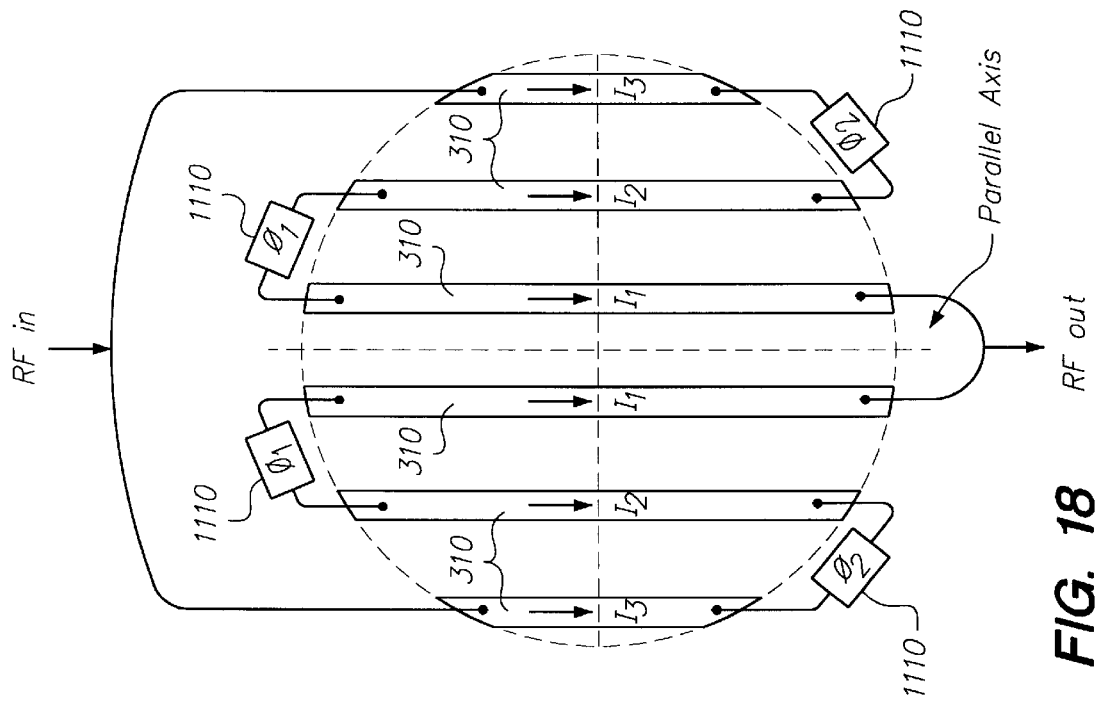
FIGS. 17 and 18 depict alternative methods for feeding radio frequency energy to the planar, parallel-element antenna arrangement of FIG. 11.
Figure 17:
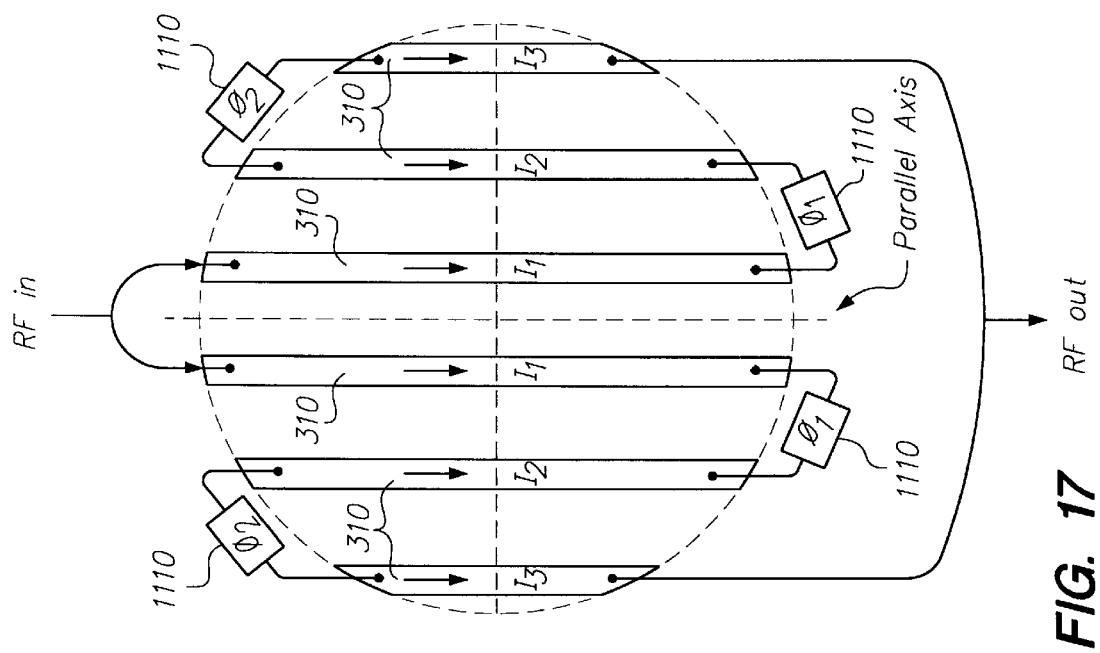

According to another aspect of the invention, a pair of elements that are symmetrically located on the left side and the right side of the parallel axis of the antenna configuration are connected together and fed with radio frequency power. FIGS. 17 and 18 show two exemplary arrangements for such an embodiment. Since elements and phase shifters are chosen to be symmetric to the parallel axis, the resulting current and voltage along antenna elements are symmetric to the parallel axis. One fewer phase shifter is needed, thereby reducing complexities and loss associated with the phase shifters. Moreover, because of slight variation of current and voltage between elements, the current and voltage can be adjusted symmetrically by feeding radio frequency energy into different pairs of elements, e.g., feeding radio frequency energy to pair #1 ($I_1$) in FIG. 17, and feeding radio frequency energy to pair #3 ($I_3$) in FIG. 18. Alternatively, radio frequency energy can be fed into pair #2 ($I_2$). This capability is especially desired in certain situations, e.g., the chamber may have some asymmetries due to an opening for wafer transport and an opening in the heated liner, where the plasma density drops near chamber walls. Advantageously, by manipulating the current and voltage distribution across the antenna array, such asymmetries can be compensated for.

Note that the radio frequency tuning in the arrangements of FIGS. 17 and 18 is quite different as compared to previously described embodiments. For example, the overall antenna impedance is approximately halved because each pair of elements are electrically in parallel.

Another exemplary embodiment according to the invention is shown in FIG. 19, wherein an entire parallel-element antenna assembly is constructed using a single conducting piece formed to provide circular interconnections between adjacent elements 310 (e.g., to fit the circular symmetry of a plasma reactor). The antenna assembly of FIG. 19 can be made either of single, solid metal or hollow metal (having a cross-section as shown in FIG. 19), through which cooling fluid can flow. In the case of hollow metal, the antenna can be either made of a single, rectangular tube or of two parts brazed, soldered or otherwise mechanically and electrically bonded. Each shunt phase shifter 1110 is connected from each node to ground. Except the central node where radio frequency energy is fed in, the rest of the nodes are located away from the center on the interconnection between two elements, e.g., node 1 (or node 2') is not located in the middle of interconnection between element 1 and 2, rather it's close to element 2. In this way, more radio frequency energy is coupled to the plasma due to the extra, circular interconnection in each antenna element.

In FIG. 19, there are a total of eight parallel elements 310 starting with a first element 1 on the right hand side. Let node i (i=1–8) denote the input end of element i looking from the radio frequency input to the termination capacitor $C_T$, and let i' represent the output end of element i looking from the radio frequency input to $C_T$. Radio frequency energy is fed into the central node 4 and terminated by C T at the node 1' so that elements located on the left side of the parallel axis (axis y) are symmetric to those on the right side. Due to this symmetry, only one side of the antenna need be analyzed for a complete understanding of the entire antenna. The right side is used in the analysis that follows.

Let $l_i$ denote the length from node i to the axis x along element i, while $l_1'$ represents the length from node i' to the axis x along element i. As before, the complex propagation constant (k=α+jβ) for a planar coil antenna can be deduced from the voltage and the current waveform measurements at the input and the output of the coil antenna. For purposes of discussion, α, β, the effective characteristic impedance $z_0$ are assumed to be the same herein. Table VII lists α, β, $z_0$, the electrical lengths $l_1$–$l_4$ and $I_1'$–$I_4'$.

TABLE VII

| α = 6.89 × 10/degrees | | β = 1.145 degree/in | | | | $z_0$ = 110Ω | |
|---|---|---|---|---|---|---|---|
| Element | #1 | | #2 | | #3 | | #4 |
| Electrical Length | $l_1'$ | $l_1$ | $l_2'$ | $l_2$ | $l_3'$ | $l_3$ | $l_4'$ | $l_4$ |
| (in) | 2.7" | 4.45" | 4.05" | 5.40" | 4.83" | 6.28" | 5.30" | 6.1" |
| (degree) | 3.1° | 5.1° | 4.64° | 6.2° | 5.53° | 7.2° | 6.07° | 7.0° |

Let $z_i$ denote the input impedance of element i at node i looking from the radio frequency input to the termination capacitor $C_T$, excluding the corresponding phase shifter at the node, while $z_1'$ represents the output impedance of element i' at node i' looking from the radio frequency input to $C_T$, excluding the corresponding phase shifter at the node. Then Table VIII lists the values of the normalized impedance $z_1'$, $z_1$–$z_4'$, $z_4$, (normalized to $z_0$,), $C_T$, and the corresponding phase shifters.

TABLE VIII

| Element i | 1 | 2 | 3 | 4 |
|---|---|---|---|---|
| Input $z_i$ | 0.1 − j0.84 | 0.03 + j1.24 | 0.04 − j0.78 | 0.09 + j.128 |
| Output $z_i'$ | 0 − j1.12 | 0.01 + j0.85 | 0.03 − j1.21 | 0.04 + j0.81 |
| L (nH) or C (pF) | $C_T$ = 95.5 | $L_1$ = 545 | $C_2$ = 174 | $L_3$ = 512 |

Once the right side is analyzed, the left side is symmetric to the right side with identical phase shifters, i.e., one can start from $C_T$ at node 8, and work towards the center (node 4) and obtain the same results as in the above table. Furthermore, node 8 on the left side of axis y can be directly connected to the symmetric counterpart, node 1' on the right side and then terminated by a single common capacitor $C_T$=2×95.5=191 pF, which is twice $C_T$ if the two nodes are separated. The overall input impedance is equal to $z_4/2$= 0.045+j 0.64, which is normalized to $z_0$, or 4.95+j 70.4 Ω (unnormalized).

FIG. 20 shows radio frequency feeding to an antenna in series using the same antenna assembly as shown in FIG. 19. This radio frequency coupling scheme is similar in concept to what shown in FIG. 11. In FIG. 20, radio frequency energy is fed to the antenna element 8 at node 8, then travels through each element sequentially, and is finally terminated by the capacitor $C_T$ at the first node 1'. The normalized impedance $z_1'$, $z_1$–$z_8'$, $z_8$, (normalized to $z_0$), $C_T$, and the corresponding phase shifters are listed below in Table IX.

TABLE IX

| Element i | 1 | 2 | 3 | 4 | 5 | 6 | 7 | 8 |
|---|---|---|---|---|---|---|---|---|
| Input $z_i$ | 0.01 − j 0.84 | 0.03 + j 1.24 | 0.04 − j 0.78 | 0.09 + j 1.28 | 0.07 − j 0.81 | 0.12 + j 1.21 | 0.10 − j 0.85 | 0.14 + j 1.11 |
| Output $z_i'$ | 0 − j 1.12 | 0.01 + j 0.85 | 0.03 − j 1.21 | 0.04 + j 0.81 | 0.09 − j 1.28 | 0.07 + j 0.77 | 0.13 − j 1.24 | 0.10 + j 0.83 |
| L (nH) or C (pF) | $C_T = 95.5$ | $L_1 = 545$ | $C_2 = 174$ | $L_3 = 512$ | $C_4 = 166$ | $L_5 = 514$ | $C_6 = 172$ | $L_7 = 550$ |

The capacitor $C_T$ and the first three phase shifters are identical to what is shown in Table VIII. Except for the phase shifter in the center ($C_4$), the phase shifters on the left side of axis y are almost symmetric to those on the right side. Furthermore, variations for all inductances or capacitances are relatively small, 7.4% maximum for the inductance, 4.8% maximum for the capacitance. It is possible from the practical point of view that one can simply use one fixed value for all the inductors or capacitors without introducing any noticeable deviation or error. In addition, the absolute inductance and capacitance are relatively small, making the antenna system of the present invention easy to manufacture. The overall input impedance is equal to $z_8$=0.14+j1.11 (normalized to $Z_0$) or 15.4+j 122.1 Ω.

Comparing the parallel RF feeding method (e.g., as in FIG. 19) with the series feeding method (e.g., as in FIG. 20), the parallel feeding method yields low impedance and high Q, while the series feeding method yields high impedance and low Q. The overall reactance in the former case is approximately half of the latter, while the Q factor should be almost doubled. A low impedance antenna may be desired for large area plasma processing such as flat panel display applications. However, high Q circuits often make the matching network difficult to match the plasma impedance.

To analyze voltage and current in these two cases, consider a situation in which power $P_{load}$ is delivered to a load. Assuming the load impedance is $$z = |z|e^{j\phi} = R + jX,$$

then $P_{load}$ is given by $$P_{load} = \frac{1}{2} V_0 I_0 \cos\varphi = \frac{1}{2} I_0^2 |z| \cos\phi = \frac{1}{2} I_0^2 R$$

where $V_0$ and $I_0$ are peak amplitudes of voltage V and current I, respectively, and $\phi$ is the phase difference between V and I (and moreover one has V=I·z and $V_0$=$I_0$|z|). Given the same input power to the antenna, $P_{load}$, the current at the antenna input end in the former case is approximately 1.8 times (square root of 3) of that in the latter case, since the resistance R in the former case is three times smaller than that in the latter case. However, the actual current to each element in the former case is about 0.9 times smaller than that in the latter case, because the current in the former case is parallel branched into two parts. Therefore, the inductive coupling to the plasma in the series feeding case is slightly better than that in the parallel feeding case.

One advantage of the parallel feeding method is that the resulting current and voltage along antenna elements are symmetric to the parallel axis (axis y), and one fewer phase shifter is needed, thereby reducing complexities and loss associated with the phase shifters. Thus, either feeding method can be utilized, depending on the specific application.

To analyze antenna tuneability, assume initially that the antenna assembly is designed to operate at one characteristic impedance, e.g., $Z_0$=110 Ω for one set of process conditions, and all the shunt phase shifters are chosen for this characteristic impedance. Once the phase shifters are determined, they will be preferably fixed for other processes. When the process changes, e.g., when going from fluorocarbon based chemistry etch to oxygen cleaning of polymer, the plasma density and the sheath thickness are changed, which affect the electrical coupling from the driving antenna to the plasma. More importantly, the phase relation between two adjacent parallel elements may be altered.

The antenna and plasma system can be considered as a lossy transmission line with antenna conducting RF and the plasma as a ground path. Between the two conductors, there are the dielectric window 120, the gas distribution plate 130, and a plasma sheath. The transmission line has a distributed shunt capacitance between the antenna and the plasma through the dielectric window, the gas distribution plate and the plasma sheath. The capacitance between the two parallel plates is then $$C = \varepsilon_r \varepsilon_0 \frac{A}{d}$$

where $\epsilon_r$ is the dielectric constant of material between two plates, $\epsilon_0$ is the vacuum permittivity, A is the area of the plate, and d is the plate spacing. In an existing oxide etcher, the window is about 0.5"-thick and made of aluminum nitride (AlN) with dielectric constant $\epsilon_r$=9. The gas distribution plate is about 0.25"-thick and made of silicon nitride (SiN) with dielectric constant $\epsilon_r$=9. Assuming the sheath has thickness of $d_{Sheath}$ and $\epsilon_r$=1, the overall capacitance $C_{tot}$ between the antenna and the plasma is the sum of all the capacitances in series, $$\frac{1}{C_{tot}} = \frac{1}{C_{Window}} + \frac{1}{C_{GDP}} + \frac{1}{C_{Sheath}}$$

$$= \left(\frac{0.75"}{9} + d_{Sheath}\right) / \varepsilon_0 A$$

$$= \frac{0.75"}{\varepsilon_{eff} \varepsilon_0 A}$$

where $C_{window}$, $C_{GDP}$, and $C_{sheath}$ are capacitances of the dielectric window, the gas distribution plate and the plasma sheath, respectively. Also, $\epsilon_{eff}$ is the effective dielectric constant in the presence of the plasma. For a typical inductive plasma, $d_{Sheath}$ ~0.2 mm (see, for example, Michael A. Leiberman and Allan J. Lichtenberg, "Principles of Plasma Discharges and Materials Processing, p. 395, A Wiley-Interscience Publication, New York, 1964), so the contribution to $C_{tot}$ from the sheath is much smaller and $C_{tot}$ is dominated by $C_{Window}$ and $C_{GDP}$. For simplicity, one can think of the effect of $d_{Sheath}$ on $C_{tot}$ as changing the effective dielectric constant ($\epsilon_{eff}$) When $d_{Sheath}$ is increased, $\epsilon_{eff}$ is decreased, and $C_{tot}$ is decreased.

The transmission line can be mainly characterized by the complex propagation constant (k=α+jβ) and characteristic impedance $z_0$. The phase constant β is determined by the phase velocity $V_{phase}$ $$\beta = \frac{\omega}{V_{phase}} \approx \frac{\omega}{c}\sqrt{\varepsilon_{\mathit{eff}}}$$

where ω=2πf and f is the RF frequency, and c is the speed of light. To the first order of approximation, $V_{phase}$ is mainly determined by the dielectric (the window and the gas distribution plate,), so the plasma sheath has relatively small effect on β. For a low loss transmission line, the characteristic impedance $z_0$ is given by $$z_0 \approx \sqrt{\frac{L}{C}} \propto \frac{1}{\sqrt{C_{tot}}} \propto \frac{1}{\sqrt{\varepsilon_{\mathit{eff}}}}$$

where L represents the series inductance per unit length, and C represents the shunt capacitance per unit length. As the sheath thickness increases, the capacitive coupling between the antenna and the plasma is decreased, i.e., $C_{tot}$ is decreased, thereby causing $z_0$ to increase. But the magnitude of the change in $z_0$ is relatively small. For example, if $d_{Sheath}$=0.2 mm, β=1.145°/inch, and $z_0$=110 Ω, then $\varepsilon_{\mathit{eff}}$ is 8.22. When $d_{Sheath}$ is increased to 0.5 mm by a factor of 2.5 times, $\varepsilon_{\mathit{eff}}$ is changed to 7.28, β is decreased to 1.078°/inch by ~6%, and $z_0$ is increased to 117 Ω by ~6%.

At 13.56 MHz, $_{Sheath}$=0.2 mm, β=1.145°/inch, and $z_0$=110 Ω are chosen initially such that the phase difference of the current between two center points in two adjacent elements is 180°. When $d_{Sheath}$ is increased to 0.5 mm, the current phase difference between two adjacent center points then becomes 186°, which introduces only 0.5% deviation in vector summation. In this sense, the antenna can maintain, fairly good phase relation when the plasma is changed.

Since β and $z_0$ change in the opposite direction, the phase angle and the reactance along the center points of all the antenna elements tend to be unbalanced or skewed, particularly when many elements are connected in series. For example, the reactances at center points change alternatively between −j110 Ω and +j110 Ω initially for β=1.145°/inch, and $z_0$=110Ω. When $d_{Sheath}$ is increased to 0.5 mm, the unnormalized reactances at center points for the series radio frequency feeding (FIG. 20) are −j111 Ω, +j108 Ω, −j116 Ω, +j103 Ω, −j123 Ω, +j99.5 Ω, −j130 Ω, and +j96 Ω, respectively for elements 1–8. Going from element 1 to 8, the inductive reactance tends to decrease every other element, while the magnitude of capacitive reactance tends to increase, which causes this skewing effect to be amplified at the last few elements. This can cause substantial change in the magnitudes of the current.

One way to compensate this skewing is to change the radio frequency. When the frequency is changed, the reactance of a shunt inductor changes in the opposite way to that of a shunt capacitor, which itself can cause the similar skewing effect on the reactances. If the frequency is changed in a proper direction, it can cancel the effect due to the plasma change. In the above example, if frequency is increased, the reactance after each shunt inductor is increased and the reactance after each shunt capacitor is decreased. Specifically, when $d_{Sheath}$ is increased to 0.5 mm, tuning the frequency slightly from 13.56 MHz to 13.70 MHz, $z_0$=117 Ω, β changes slightly to 1.089°/inch because β is proportional to frequency, then the phase difference between two adjacent center points is still 186.3° on average, and the unnormalized reactances at center points for the series RF feeding (FIG. 20) are −j110 Ω, +j111 Ω, −j109 Ω, +j112 Ω, −j110 Ω, +j112 Ω, −j110 Ω, and +j112 Ω, respectively for elements 1–8, resulting in very uniform reactances along all the elements. Therefore, the currents among all elements can be uniformly balanced.

Figure 21:
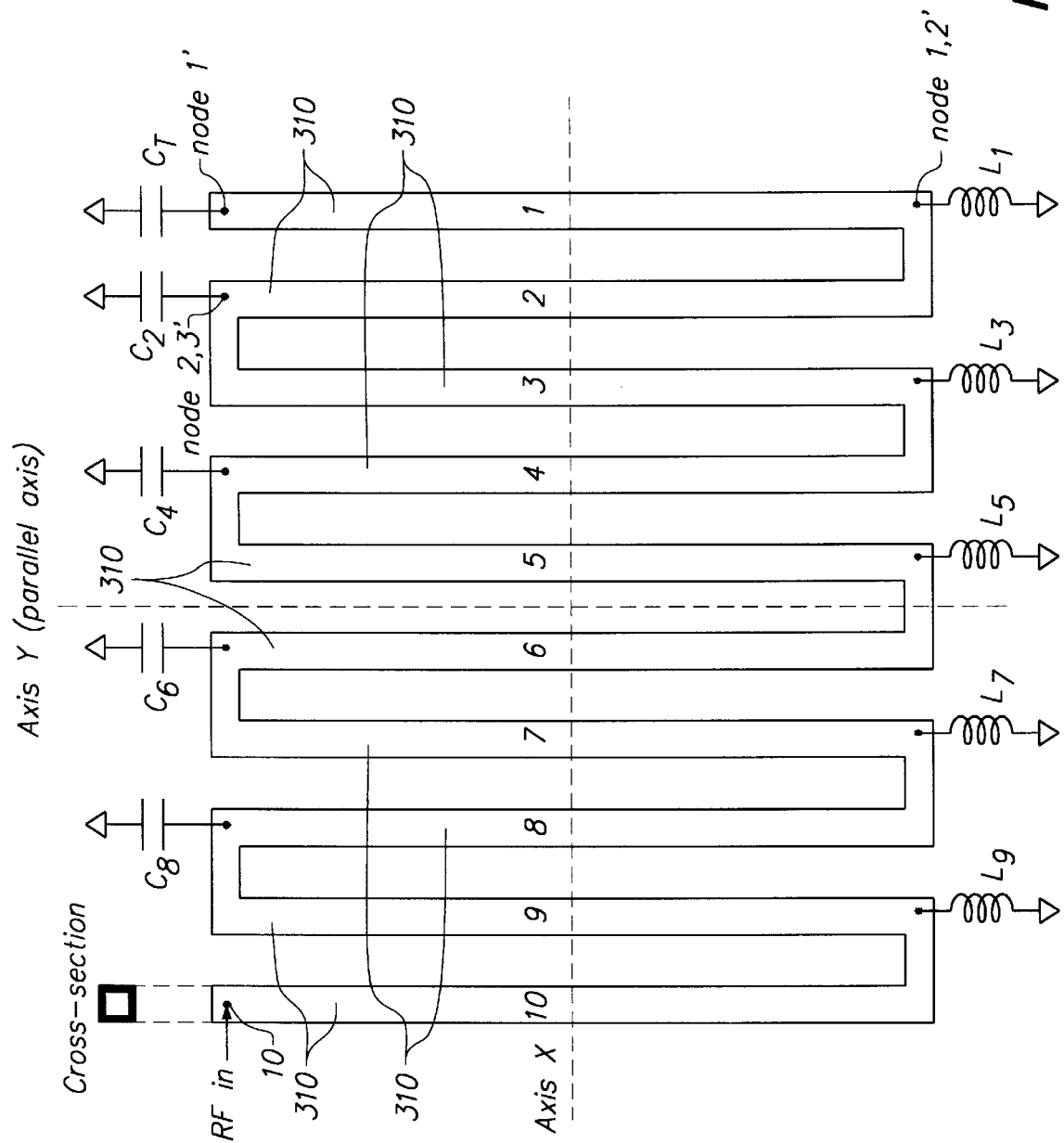
FIG. 21 depicts a rectangular-shaped antenna arrangement alternative to the planar, parallel-element antenna arrangement of FIG. 11.

FIG. 21 shows a rectangular, parallel antenna array according to the invention which can be used with a reactor having rectangular symmetry. It is possible to use a rectangular (or square) chamber to process a rectangular (or square) object like a flat panel display. Each element has identical length and the entire assembly can be constructed easily. Again, the same construction principles discussed above (e.g., with respect to FIG. 11 and 20) can be applied to the antenna of FIG. 21. Radio frequency energy is fed to the tenth antenna element 10 at node 10, then travels through each element sequentially, and is finally terminated by the capacitor $C_T$ at node 1'.

The foregoing has described the principles, preferred embodiments and modes of operation of the present invention. However, the invention should not be construed as being limited to the particular embodiments discussed. Thus, the above-described embodiments should be regarded as illustrative rather than restrictive, and it should be appreciated that variations may be made in those embodiments by workers skilled in the art without departing from the scope of the present invention as defined by the following claims.

What is claimed is:

1. An apparatus for generating a transformer coupled plasma, the apparatus comprising:
    a plasma reaction chamber having a window forming an electro-magnetic field path into the chamber and a process gas supply configured to introduce process gas into the chamber;
    a radio frequency antenna comprising at least two antenna segments disposed proximate an exterior surface of the window of the chamber;
    a radio frequency source coupled to the antenna and configured to resonate a radio frequency current in the antenna segments, wherein electromagnetic fields induced by the radio frequency current are effective to excite and ionize the process gas and to thereby generate a plasma within the chamber; and
    a phase shifter interconnecting first and second of the antenna segments and configured to distribute radio frequency current flow in the antenna such that an instantaneous direction of radio frequency current in the first antenna segment is substantially the same as an instantaneous direction of radio frequency current in the second antenna segment.

2. The apparatus of claim 1, wherein a density of the generated plasma is substantially uniform within an area spanned by the at least two antenna segments.

3. The apparatus of claim 1, wherein the phase shifter includes a capacitor.

4. The apparatus of claim 1, wherein the phase shifter includes an inductor.

5. The apparatus of claim 1, wherein the phase shifter is configured to shunt radio frequency current to ground.

6. The apparatus of claim 1, wherein the phase shifter is configured to be in series with the radio frequency current.

7. The apparatus of claim 1, wherein the at least two antenna segments are coplanar.

8. The apparatus of claim 1, wherein the first and the second of the antenna segments are rectilinear and are configured in an adjacent and parallel position relative to each other, and are electrically interconnected in series via the phase shifter.

9. The apparatus of claim 1, wherein the first and the second of the antenna segments are configured in a parallel position relative to each other and lie in a smooth, curved surface, and are electrically interconnected in series via the phase shifter.

10. The apparatus of claim 9, wherein the curved surface is a dome.

11. The apparatus of claim 9, wherein the curved surface is a hemisphere.

12. The apparatus of claim 9, wherein the curved surface is a half-cylinder.

13. The apparatus of claim 1, wherein the antenna is shaped to conform with a cross-sectional area of the reaction chamber.

14. The apparatus of claim 1, wherein the at least two antenna segments are sections of a single conducting element.

15. The apparatus of claim 1, wherein the antenna includes three or more antenna segments, each antenna segment being connected to at least one other antenna segment via a phase shifter, the phase shifters being effective to distribute radio frequency current flow in the antenna such that an instantaneous direction of radio frequency current in each antenna segment is substantially the same.

16. The apparatus of claim 1, wherein the at least two antenna segments are powered by a single radio frequency power source.

17. The apparatus of claim 1, wherein the antenna comprises a plurality of antenna segments, at least two of the antenna segments being powered by separate radio frequency power sources.

18. The apparatus of claim 1, wherein two adjacent antenna segments are interconnected such that a first end of one of the two adjacent antenna segments is coupled to a closest end of the other of the two adjacent antenna segments.

19. The apparatus of claim 1, wherein two adjacent antenna segments are interconnected such that a first end of one of the two adjacent antenna segments is coupled to an opposite end of the other of the two adjacent antenna segments.

20. The apparatus of claim 1, wherein the at least two antenna segments are fed in series such that radio frequency current passes sequentially through each successive antenna segment.

21. The apparatus of claim 1, wherein the at least two antenna segments are fed at least partially in parallel, such that radio frequency current is applied simultaneously to at least one symmetric pair of antenna segments.

22. The apparatus of claim 1, wherein each antenna segment consists of a center conductor and an electrically isolated outer conducting shell, and wherin a second radio frequency source is coupled to each conducting shield and configured to provide a radio frequency voltage to the antenna, the radio frequency voltage being effective to provide independent capacitive coupling to the plasma.

23. The apparatus of claim 1, wherein a size of each antenna segment, and thus a characteristic impedance of each antenna segment, is adjusted to compensate for imbalances across the antenna and to thereby equalize radio frequency voltage and current across the antenna.

24. The apparatus of claim 1, further comprising a ground plane situated proximate the antenna, wherein the ground plane is positioned such that a first portion of the ground plane is closer to the antenna than is a second portion of the ground plane, the positioning of the ground plane being effective to compensate for impedance imbalances across the antenna and to thereby equalize radio frequency voltage and current across the antenna.

25. A method for generating a transformer coupled plasma, the method comprising the steps of:

introducing a process gas into a plasma reaction chamber; and applying a radio frequency current to an antenna comprising at least two antenna segments, a first and a second antenna segment being disposed proximate an exterior surface of a window of the chamber and interconnected via a phase shifter, the phase shifter being effective to distribute radio frequency current flow in the antenna such that an instantaneous direction of radio frequency current in the first antenna segment is substantially the same as an instantaneous direction of radio frequency current in the second antenna segment, and the radio frequency current in the antenna being effective to excite and ionize the process gas and to thereby generate a plasma within the chamber.

26. The method of claim 25, wherein a density of the generated plasma is substantially uniform within an area spanned by the at least two antenna segments.

27. The method of claim 25, wherein the phase shifter includes a capacitor.

28. The method of claim 25, wherein the phase shifter includes an inductor.

29. The method of claim 25, wherein the phase shifter is configured to shunt radio frequency current to ground.

30. The method of claim 25, wherein the phase shifter is configured to be in series with the radio frequency current.

31. The method of claim 25, wherein the plasma processes a semiconductor substrate by etching an exposed surface of the substrate or depositing a film onto the substrate.

32. The method of claim 25, wherein the semiconductor substrate comprises one of a 300 mm semiconductor wafer and a flat panel display.

33. The method of claim 25, wherein the antenna comprises a plurality of antenna segments, and wherein the method includes the step of powering at least two of the antenna segments using separate radio frequency power sources.

34. The method of claim 25, wherein each of the antenna segments is encompassed by a conducting shield, and wherein the method comprises the step of applying radio frequency power to the conducting shields to thereby provide independent capacitive coupling to the plasma.

* * * * *